US011895379B2

(12) United States Patent
Park et al.

(10) Patent No.: US 11,895,379 B2
(45) Date of Patent: Feb. 6, 2024

(54) ELECTRONIC DEVICE

(71) Applicant: Samsung Electronics Co., Ltd., Gyeonggi-do (KR)

(72) Inventors: Jungsik Park, Gyeonggi-do (KR); Taewoo Kim, Gyeonggi-do (KR); Sangyoup Seok, Gyeonggi-do (KR); Kwonho Son, Gyeonggi-do (KR); Sunghyup Lee, Gyeonggi-do (KR); Heeseok Jung, Gyeonggi-do (KR)

(73) Assignee: Samsung Electronics Co., Ltd

( * ) Notice: Subject to any disclaimer, the term of this patent is extended or adjusted under 35 U.S.C. 154(b) by 69 days.

(21) Appl. No.: 17/546,697

(22) Filed: Dec. 9, 2021

(65) Prior Publication Data

US 2022/0191352 A1 Jun. 16, 2022

Related U.S. Application Data

(63) Continuation of application No. PCT/KR2021/018024, filed on Dec. 1, 2021.

(30) Foreign Application Priority Data

Dec. 16, 2020 (KR) .................. 10-2020-0176695

(51) Int. Cl.
*H04N 23/51* (2023.01)
*H04M 1/02* (2006.01)

(52) U.S. Cl.
CPC .......... *H04N 23/51* (2023.01); *H04M 1/0264* (2013.01)

(58) Field of Classification Search
CPC ........ H04N 23/50; H04N 23/51; H04N 23/54; H04N 23/55; H04N 23/56; H04N 23/57; H04M 1/0264

USPC ......................................................... 348/374
See application file for complete search history.

(56) References Cited

U.S. PATENT DOCUMENTS

| | | | |
|---|---|---|---|
| 9,554,041 B1 | 1/2017 | Shin et al. | |
| 2017/0095667 A1 | 4/2017 | Yakovlev et al. | |
| 2018/0241861 A1* | 8/2018 | Kim | ............... G06F 1/1656 |
| 2019/0082536 A1 | 3/2019 | Park et al. | |

(Continued)

FOREIGN PATENT DOCUMENTS

| | | | | |
|---|---|---|---|---|
| CN | 110995907 A | * | 4/2020 | ............ H04M 1/026 |
| CN | 111901463 A | * | 11/2020 | .......... H04M 1/0264 |

(Continued)

OTHER PUBLICATIONS

International Search Report dated Mar. 11, 2022 issued in counterpart application No. PCT/KR2021/018024, 13 pages.

*Primary Examiner* — Anthony J Daniels
(74) *Attorney, Agent, or Firm* — The Farrell Law Firm, P.C.

(57) ABSTRACT

An electronic device is provided that includes a housing, a first circuit board disposed within the housing, a second circuit board spaced apart from the first circuit board, a first component and a second component disposed on at least a portion of the first circuit board or at least a portion of the second circuit board, and an interposer electrically connecting the first circuit board and the second circuit board. The interposer may be disposed between the first circuit board and the second circuit board. An arrangement space for disposing the first component and the second component may be formed between the first circuit board and the second circuit board.

20 Claims, 21 Drawing Sheets

(56) References Cited

U.S. PATENT DOCUMENTS

| | | |
|---|---|---|
| 2019/0320050 A1 | 10/2019 | Lim et al. |
| 2020/0093040 A1 | 3/2020 | Yun et al. |
| 2020/0184943 A1 | 6/2020 | Tisch et al. |
| 2021/0234948 A1 * | 7/2021 | Li .......................... H04M 1/18 |
| 2021/0392736 A1 | 12/2021 | Koo et al. |

FOREIGN PATENT DOCUMENTS

| | | | |
|---|---|---|---|
| CN | 211860199 | 11/2020 | |
| EP | 3373564 A1 * | 9/2018 | ............ H04M 1/026 |
| JP | 2004-120598 | 4/2004 | |
| KR | 1020180096178 | 8/2018 | |
| KR | 1020190029215 | 3/2019 | |
| KR | 1020190121119 | 10/2019 | |
| KR | 1020190125461 | 11/2019 | |
| KR | 1020190139653 | 12/2019 | |
| KR | 1020200032911 | 3/2020 | |
| KR | 1020200045261 | 5/2020 | |
| KR | 1020210054431 | 5/2021 | |

\* cited by examiner

ELECTRONIC DEVICE

CROSS-REFERENCE TO RELATED APPLICATIONS

This application is a bypass continuation of International Application No. PCT/KR2021/018024 designating the United States, filed on Dec. 1, 2021 in the Korean Intellectual Property Receiving Office, which claims priority to Korean Patent Application No. 10-2020-0176695, filed on Dec. 16, 2020 in the Korean Intellectual Property Office, the disclosures of all of which are incorporated herein by reference in their entireties.

BACKGROUND

1. Field

The disclosure is related generally to an electronic device, and more particularly, to an electronic device having a secured space for internal components.

2. Description of Related Art

Advancements in the fields of information communication and semiconductor technologies have accelerated the spread and use of various electronic devices.

The term "electronic device" may refer to a device that performs a particular function according to its equipped program, such as, for example, a home appliance, an electronic scheduler, a portable multimedia player, a mobile communication terminal, a tablet personal computer (PC), a video/sound device, a desktop PC or laptop computer, or a navigation system for an automobile. Since electronic devices are highly integrated, and as high-speed, high-volume wireless communication becomes commonplace, electronic devices have been various functions. For example, an electronic device comes with integrated functionality, that includes an entertainment function, such as playing video games, a multimedia function, such as replaying music/videos, a communication and security function for mobile banking, and a scheduling or e-wallet function. Such electronic devices have become compact enough for users to carry in a convenient way.

The electronic devices may output stored information as voices or images. Accordingly, the electronic device typically include a microphone and a speaker to input and output sound. The electronic device has a structure in which a plurality of components, other than a microphone and a speaker, are also disposed. For example, the microphone and speaker have a structure in which external sound output or introduced through a sound hole formed in a case of the electronic device is transferred.

One circuit board provided in the electronic device may have an increased surface area upon which a plurality of components, other than the microphone and the speaker, are disposed. When a space is separately secured for the circuit board within the electronic device, the size of the electronic device increases, which may limit miniaturization of the electronic device.

A separate sealing member may be installed in a sound hole, which is for outputting or introducing external sound, and may be formed in the case of the electronic device so as to block foreign substances from entering the electronic device. For example, when the case of the electronic device is vibrated by external sound introduced through the sound hole, the sealing member may be easily damaged by the vibration, thereby deteriorating the sealing function of the sealing member.

SUMMARY

According to an embodiment, in an electronic device, it is possible to secure a space, in which a plurality of components (e.g., a microphone and/or a speaker) may be disposed, by disposing an interposer between the first circuit board and the second circuit board.

According to an embodiment, in the electronic device, it is possible to reduce damage to the sealing member, resulting from external influence (e.g., vibration), by placing the sealing member on at least a portion of the camera deco, which is less affected by the external influence.

According to an aspect of the disclosure, an electronic device is provided that includes a housing including a first plate facing a first direction, a second plate facing a second direction that is opposite to the first direction, and a side member surrounding a space between the first plate and the second plate. The electronic device also includes a camera deco disposed on at least one of the first plate and the second plate, a flash disposed proximate to the camera deco, a first circuit board disposed to overlap at least a portion of the flash when viewed in the first direction, and a second circuit board spaced apart from the first circuit board. The electronic device further includes a first sealing member disposed between the second plate and the flash, a second sealing member disposed between the flash and at least one of the first circuit board and the second circuit board, a first component and a second component disposed on at least a portion of the first circuit board or at least a portion of the second circuit board, and an interposer electrically connecting the first circuit board and the second circuit board. A passage for transferring a sound is disposed between a flash hole formed in the second plate and a through hole formed in the flash. The interposer may be disposed between the first circuit board and the second circuit board. An arrangement space for disposing the first component and the second component may be formed between the first circuit board and the second circuit board.

According to an aspect of the disclosure, an electronic device is provided that includes a housing including a first plate facing a first direction, a second plate facing a second direction that is opposite to the first direction, and a side member surrounding a space between the first plate and the second plate. The electronic device also includes a camera deco disposed on at least one of the first plate and the second plate, a first circuit board disposed to overlap at least a portion of the camera deco when viewed in the first direction, and a second circuit board spaced apart from the first circuit board. The electronic device further includes a sealing member disposed between the camera deco and at least one of the first circuit board and the second circuit board, a first component and a second component disposed on at least a portion of the first circuit board or at least a portion of the second circuit board, and an interposer electrically connecting the first circuit board and the second circuit board. The interposer is disposed between the first circuit board and the second circuit board. An arrangement space for disposing the first component and the second component may be formed between the first circuit board and the second circuit board.

According to an aspect of the disclosure, an electronic device is provided that includes a housing, a camera deco formed in at least a portion of the housing, and a camera module disposed on the camera deco and including a camera flange. The electronic device also includes a first sealing member disposed between the camera deco and a first surface of the camera flange, a circuit board disposed on a second surface of the camera flange that is opposite to the first surface, a second sealing member disposed between the second surface of the camera flange and the circuit board, and a component disposed on at least a portion of the circuit board.

According to an aspect of the disclosure, an electronic device is provided that includes a housing, a first circuit board disposed on at least a portion of the housing and disposed within the housing, a second circuit board spaced apart from the first circuit board, a first component and a second component disposed on at least a portion of the first circuit board or at least a portion of the second circuit board, and an interposer electrically connecting the first circuit board and the second circuit board. The interposer may be disposed between the first circuit board and the second circuit board. An arrangement space for disposing the first component and the second component may be formed between the first circuit board and the second circuit board.

Accordingly, it is possible to stack the first and second circuit boards using the interposer while simultaneously forming an arrangement space between the first and second circuit boards. Since a plurality of components may be disposed in the arrangement space, it is possible to efficiently use the internal space of the electronic device while also downsizing the electronic device by reducing the size of the first and second circuit boards.

It is also possible to reduce damage to the sealing member by placing the sealing member on at least a portion of the camera deco, which is less affected by external influence.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
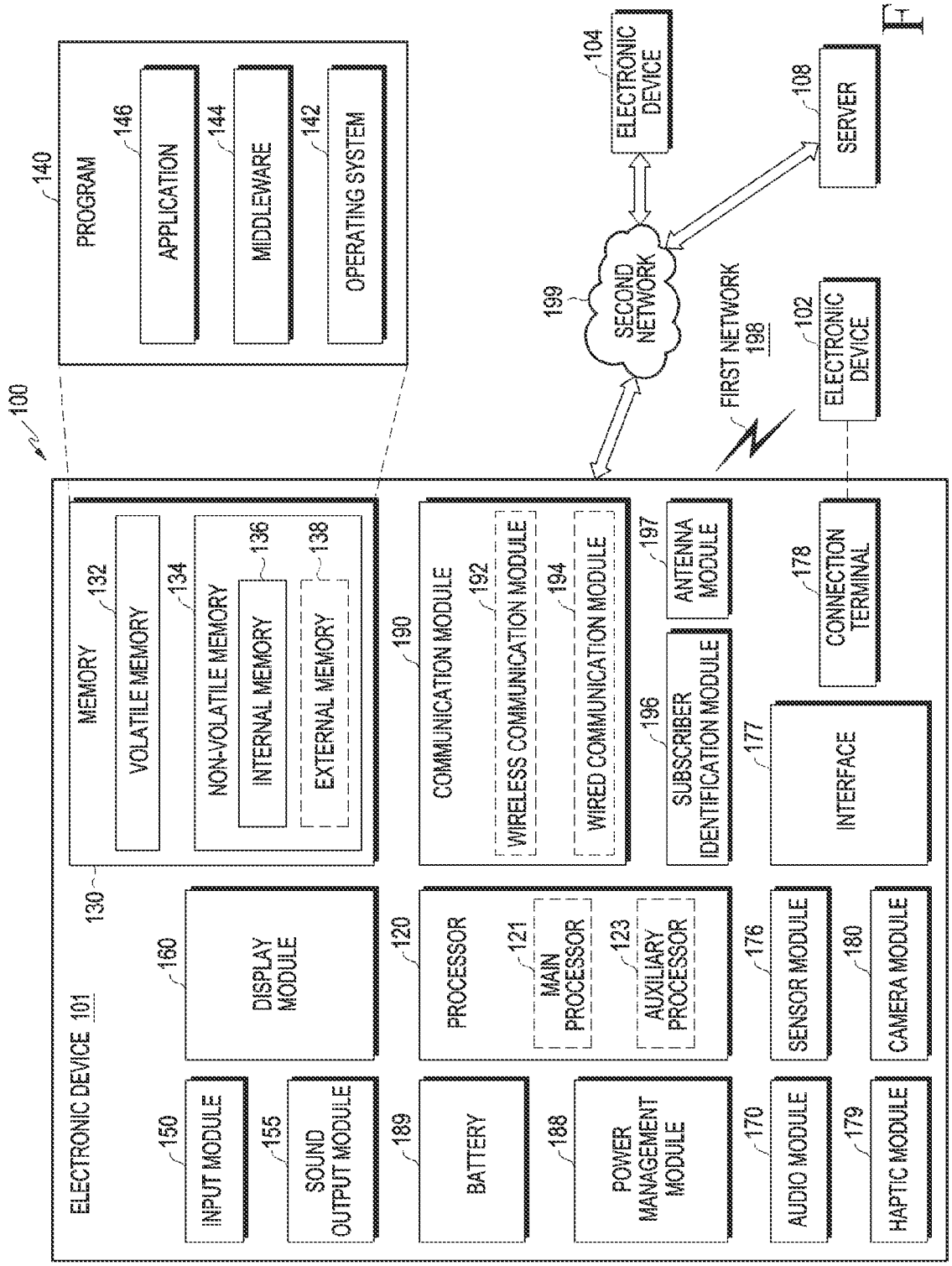
FIG. 1 is a block diagram illustrating an electronic device in a network environment, according to an embodiment.

Embodiments are described in detail with reference to the accompanying drawings. The same or similar components may be designated by the same or similar reference numerals although they are illustrated in different drawings. Detailed descriptions of constructions or processes known in the art may be omitted to avoid obscuring the subject matter of the disclosure. The embodiments and the terms used therein are not intended to limit the technology disclosed herein to specific forms, and should be understood to include various modifications, equivalents, and/or alternatives to the corresponding embodiments. A singular expression may include a plural expression unless they are definitely different in a context.

FIG. 1 is a block diagram illustrating an electronic device 101 in a network environment 100, according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108.

According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one (e.g., the connecting terminal 178) of the components may be omitted from the electronic device 101, or one or more other components may be added in the electronic device 101. According to an embodiment, some (e.g., the sensor module 176, the camera module 180, or the antenna module 197) of the components may be integrated into a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g. supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display 160 may include, for example, a display, a hologram device, or a projector and control circuitry to control a corresponding one of the display, hologram device, and projector. According to an embodiment, the display 160 may include a touch sensor configured to detect a touch, or a pressure sensor configured to measure the intensity of a force generated by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5G network, a next-generation communication network, the Internet, or a computer network (e.g., local area network (LAN) or wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device). According to an embodiment, the antenna module 197 may include one antenna including a radiator formed of a conductor or conductive pattern formed on a substrate (e.g., a printed circuit board (PCB)). According to an embodiment, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment, other parts (e.g., radio frequency integrated circuit (RFIC)) than the radiator may be further formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment, the external electronic device 104 may include an Internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smartcar, or health-care) based on 5G communication technology or IoT-related technology.

The electronic device according to various embodiments of the disclosure may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

A method according to various embodiments of the disclosure may be included and provided in a computer program product. The computer program products may be traded as commodities between sellers and buyers. The computer program product may be distributed in the form of a machine-readable storage medium (e.g., compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. Some of the plurality of entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
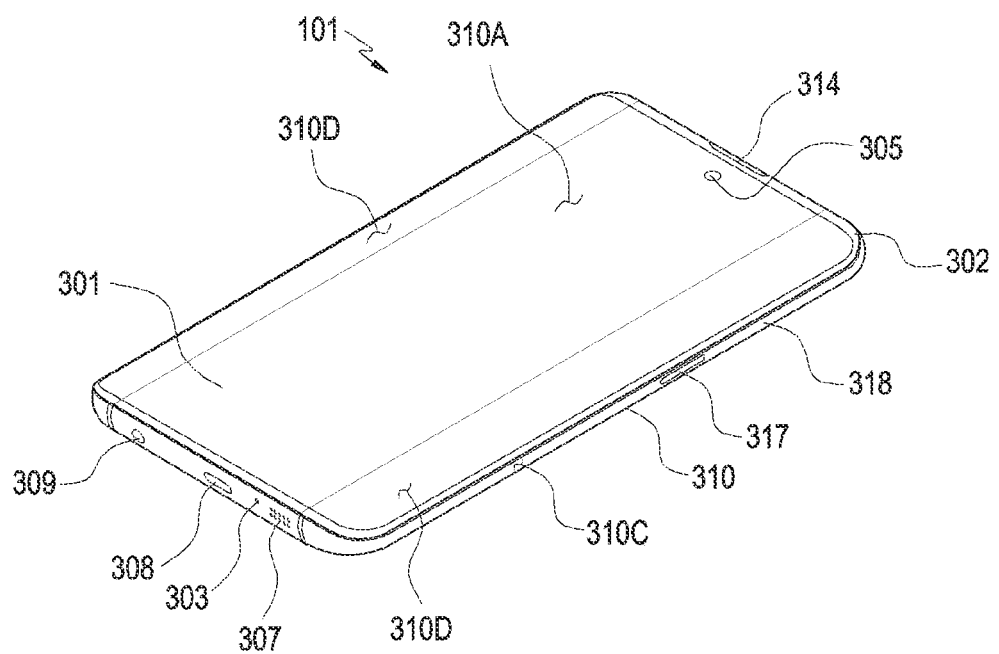
FIG. 2 is a diagram illustrating a front perspective view of an electronic device, according to an embodiment.
Figure 3:
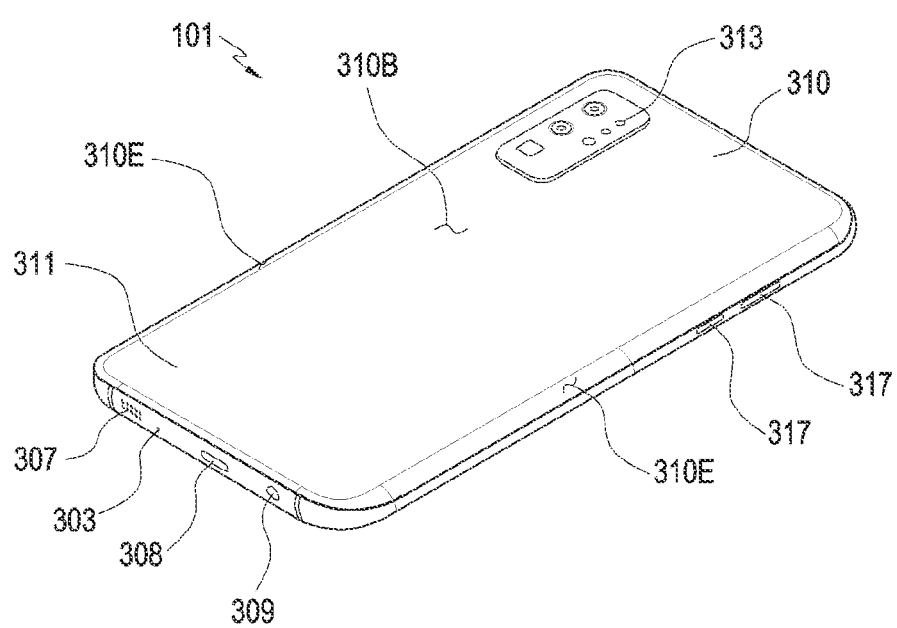
FIG. 3 is a diagram illustrating a rear perspective view of an electronic device, according to an embodiment.

FIG. 2 is a diagram illustrating a front perspective view of an electronic device, according to an embodiment. FIG. 3 is a diagram illustrating a rear perspective view of an electronic device, according to an embodiment.

Referring to FIGS. 2 and 3, an electronic device 101 includes a housing 310 with a front surface 310A, a rear surface 310B, and a side surface 310C surrounding a space between the front surface 310A and the rear surface 310B. According to another embodiment, the housing 310 may denote a structure forming part of the front surface 310A, the rear surface 310B, and the side surface 310O of FIG. 2. At least part of the front surface 310A has a substantially transparent front plate 302 (e.g., a glass plate or polymer plate including various coat layers). The rear surface 310B is formed by a rear plate 311. The rear plate 311 may be formed of, e.g., glass, ceramic, polymer, metal (e.g., aluminum, stainless steel (STS), or magnesium), or a combination of at least two thereof. The side surface 310C is formed by a side bezel structure (or a side member) 318 that couples to the front plate 302 and the rear plate 311 and includes a metal and/or polymer. The rear plate 311 and the side bezel plate 318 may be integrally formed together and include the same material (e.g., glass, metal, such as aluminum, or ceramic)

As shown in FIG. 2, the front plate 302 includes two first edge areas 310D, which seamlessly and bendingly extend from the first surface 310A to the rear plate 311, on both the long edges of the front plate 302. As shown in FIG. 3 the rear plate 311 includes two second edge areas 310E, which seamlessly and bendingly extend from the rear surface 310B to the front plate, on both the long edges. The front plate 302 (or the rear plate 311) may include only one of the first edge areas 310 (or the second edge areas 310E). Alternatively, the first edge areas 310D or the second edge areas 301E may partially be excluded. From a side view of the electronic device 101, the side bezel structure 318 may have a first thickness (or width) for sides that do not have the first edge areas 310D or the second edge areas 310E, and a second thickness, which is smaller than the first thickness, for sides that have the first edge areas 310D or the second edge areas 310E.

The electronic device 101 includes at least one of a display 301, audio modules 303, 307, and 314 (e.g., the audio module 170 of FIG. 1), a sensor module (e.g., the sensor module 176 of FIG. 1), camera modules 305, 312, and 313 (e.g., the camera module 180 of FIG. 1), a key input device 317 (e.g., the input module 150 of FIG. 1), and connector holes 308 and 309 (e.g., the connection terminal 178 of FIG. 1). The electronic device 101 may exclude at least one of the components or may include additional components.

The display 301 may be visually exposed through, for example, a majority of the front plate 302. At least a portion of the display 301 may be exposed through the front plate 302 forming the front surface 310A and the first edge areas 310D. The edge of the display 301 may be formed to be substantially the same shape as an adjacent outer edge of the front plate 302. According to another embodiment, the interval between the outer edge of the display 301 and the outer edge of the front plate 302 may remain substantially even in order to provide the display 301 with a larger area of exposure.

The surface (or the front plate 302) of the housing 310 may include a visually exposed screen display area formed as the display 301. For example, the screen display area may include the front surface 310A and first edge areas 310D.

According to another embodiment, a recess or opening may be formed in a portion of the screen display area (e.g., the front surface 310A or the first edge area 310D) of the display 301, and at least one or more of the audio module 314, a sensor module, a light emitting device, and the camera module 305 may be aligned with the recess or opening. According to another embodiment, one or more of the audio module 314, the sensor module, the camera module 305, a fingerprint sensor, and the light emitting device may be included on the rear surface of the screen display area of the display 301. The display 301 may be coupled with, or adjacent to, a touch detecting circuit, a pressure sensor capable of measuring the strength (pressure) of touches, and/or a digitizer for detecting a magnetic field-type stylus pen. At least part of the key input device 317 may be disposed in the first edge areas 310D and/or the second edge areas 310E.

The audio modules 303, 307, and 314 may include, for example, the microphone hole 303 and the speaker holes 307 and 314. The microphone hole 303 may have a microphone disposed inside to obtain external sounds. There may be a plurality of microphones to enable the detection of the direction of a sound. The speaker holes 307 and 314 may include the external speaker hole 307 and the phone receiver hole 314. The speaker holes 307 and 314 and the microphone hole 303 may be implemented as a single hole, or a speaker may be included without the speaker holes 307 and 314 (e.g., as a piezo speaker). The audio modules 303, 307, and 314 are not limited to the above-described structure. Depending on the structure of the electronic device 101, various design changes may be made. For example, only some of the audio modules may be mounted, or a new audio module may be added.

The sensor modules may generate an electrical signal or a data value corresponding to an internal operating state or external environmental state of the electronic device 101. The sensor modules may include a first sensor module (e.g., a proximity sensor) and/or a second sensor module (e.g., a fingerprint sensor) disposed on the front surface 310A of the housing 310, and/or a third sensor module (e.g., an heart rate monitor (HRM) sensor) and/or a fourth sensor module (e.g., a fingerprint sensor) disposed on the rear surface 310B of the housing 310. The fingerprint sensor may be disposed on the rear surface 310B as well as on the front surface 310A (e.g., the display 301) of the housing 310. The electronic device 101 may include a sensor module that is not shown (e.g., at least one of a gesture sensor, a gyro sensor, a barometric sensor, a magnetic sensor, an acceleration sensor, a grip sensor, a color sensor, an infrared (IR) sensor, a biometric sensor, a temperature sensor, a humidity sensor, or an illuminance sensor). The sensor modules are not limited to the above-described structure. Depending on the structure of the electronic device 101, various design changes may be made. For example, only some of the sensor modules may be mounted, or a new sensor module may be added.

The camera modules 305, 312, and 313 may include the first camera module 305 disposed on the first surface 310A of the electronic device 101, and the rear camera device 312 and/or the flash 313 disposed on the rear surface 310B. The camera modules 305 and 312 may include one or more lenses, an image sensor, and/or an image signal processor. The flash 313 may include a light emitting diode (LED) or a xenon lamp. Two or more lenses (e.g., an infrared (IR) camera, a wide-angle lens, and a telescopic lens) and image sensors may be disposed on one surface of the electronic device 101. The camera modules 305, 312, and 313 are not limited to the above-described structure. Depending on the structure of the electronic device 101, various design changes may be made. For example, only some of the camera modules may be mounted, or a new camera module may be added.

The electronic device 101 may include a plurality of camera modules a dual camera or triple camera) having different attributes (e.g., angle of view) or functions. For example, a plurality of camera modules 305 and 312 including lenses having different angles of view may be configured, and the electronic device 101 may change the angle of view of the camera modules 305 and 312 performed by the electronic device 101 based on the user's selection. At least one of the plurality of camera modules 305 and 312 may form, for example, a wide-angle camera and at least another of the plurality of camera modules may form a telephoto camera. Similarly, at least one of the plurality of camera modules 305 and 312 may be a front camera and at least another of the plurality of camera modules may be a rear camera. Further, the plurality of camera modules 305 and 312 may include at least one of a wide-angle camera, a telephoto camera, and an infrared (IR) camera (e.g., a time of flight (TOF) camera, a structured light camera). The IR camera may be operated as at least a portion of the sensor module. For example, the TOF camera may be operated as at least a portion of a sensor module for detecting the distance to the subject.

The key input device 317 is disposed on the side surface 310C of the housing 310. The electronic device 101 may exclude all or some of the above-described key input devices 317 and the excluded key input devices 317 may be implemented in other forms (e.g., as soft keys), on the display 301. The key input device may include the sensor module 316 disposed on the second surface 310B of the housing 310.

The light emitting device may be disposed on the front surface 310A of the housing 310. The light emitting device may provide information about the state of the electronic device 101 in the form of light. The light emitting device may provide a light source that interacts with the front camera module 305. The light emitting device may include a light emitting device (LED), an infrared (IR) LED, and/or a xenon lamp.

The connector holes 308 and 309 may include the first connector hole 308 for receiving a connector (e.g., a universal serial bus (USB) connector) for transmitting or receiving power and/or data to/from an external electronic device, and the second connector hole 309 (e.g., an earphone jack) for receiving a connector for transmitting or receiving audio signals to/from the external electronic device.

Some of the camera modules 305 and 312 and/or some of the sensor modules may be exposed to the outside through at least a portion of the display 301. For example, the camera module 305 may include a punch hole camera disposed inside a hole or recess formed in the rear surface of the display 301. The camera module 312 may be disposed inside the housing 310 so that the lens is visually exposed to the second surface 310B of the electronic device 101. For example, the camera module 312 may be disposed on a printed circuit board (e.g., the printed circuit board 340 of FIG. 4).

The camera module 305 and/or the sensor module may be disposed to contact the external environment through a transparent area from the internal space of the electronic device 101 to the front plate 302 of the display 301. Further, some sensor module 304 may be disposed to perform its functions without being visually exposed through the front plate 302 in the internal space of the electronic device.

Figure 4:
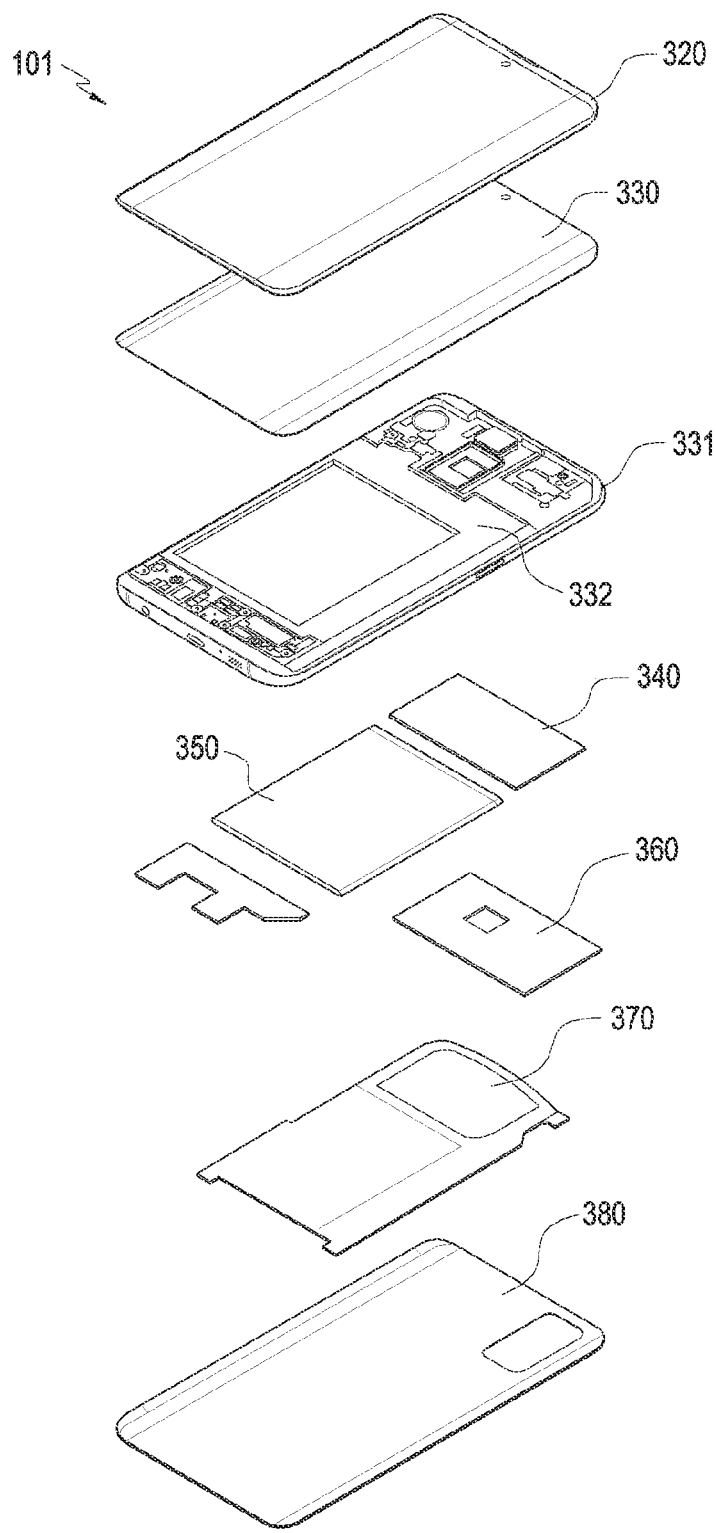
FIG. 4 is a diagram illustrating an exploded perspective view of an electronic device, according to an embodiment.

FIG. 4 is a diagram illustrating an exploded perspective view of an electronic device, according to an embodiment.

Referring to FIG. 4, the electronic device 101 includes a side bezel structure 331 (e.g., the side bezel structure 318 of FIG. 2), a first supporting member 332, the front plate 320, a display 330, a printed circuit board (PCB) 340 (e.g., a flexible PCB (FPCB), or a rigid flexible PCB (RFPCB)), a battery 350, a second supporting member 360 (e.g., a rear case), an antenna 370, and a rear plate 380. The electronic device 101 may exclude at least one of the components or include additional components. At least one of the components of the electronic device 101 may be the same or similar to at least one of the components of the electronic device 101 of FIG. 2 or 3, and a duplicate description of such components is omitted.

The first supporting member 332 is disposed inside the electronic device 101 and is connected with the side bezel structure 331 or integrated with the side bezel structure 331. The first supporting member 332 may be formed of a metal and/or non-metallic material (e.g., polymer). The display 330 may be joined onto one surface of the first supporting member 332, and the PCB 340 may be joined onto the opposite surface of the first supporting member 311.

A processor, a memory, and/or an interface may be mounted on the PCB 340. The processor may include one or more of a central processing unit (CPU), an application processor, a graphic processing device, an image signal processing, a sensor hub processor, and a communication processor. The PCB 340 may include a FPCB-type radio frequency cable (RFC). For example, the PCB 340 may be disposed on at least a portion of the first supporting member 332 and may be electrically connected with an antenna module 197 and a communication module 190.

The memory may include a volatile or non-volatile memory.

The interface may include, for example, a high definition multimedia interface (HDMI), a universal serial bus (USB) interface, a secure digital (SD) card interface, and/or an audio interface. The interface may electrically or physically connect the electronic device 101 with an external electronic device and may include a USB connector, an SD card/multimedia card (MMC) connector, or an audio connector.

The battery 350 may be a device for supplying power to at least one component of the electronic device 101. The battery 189 may include, for example, a primary cell which is not rechargeable, a secondary cell which is rechargeable, or a fuel cell. At least a portion of the battery 350 may be disposed on substantially the same plane as the printed circuit board 340. The battery 350 may be integrally or detachably disposed inside the electronic device 101.

The second supporting member 360 may be disposed between the PCB 340 and the antenna 370. For example, the second supporting member 360 may include one surface to which at least one of the PCB 340 and the battery 350 is coupled, and another surface to which the antenna 370 is coupled.

The antenna 370 may be disposed between the rear plate 380 and the battery 350. The antenna 370 may include, for example, a near-field communication (NFC) antenna, a wireless charging antenna, and/or a magnetic secure transmission (MST) antenna. The antenna 370 may perform short-range communication with an external device or may wirelessly transmit or receive power necessary for charging. An antenna structure may be formed by a portion or combination of the side bezel structure 331 and/or the first supporting member 332.

The rear plate 380 may form at least a portion of the rear surface (e.g., the second surface 310B of FIG. 3) of the electronic device 101.

The electronic device 101 has a bar-type or plate-type appearance but the disclosure is not limited thereto. For example, the illustrated electronic device may be part of a foldable electronic device and/or a rollable electronic device. The terms "foldable electronic device" and "rollable electronic device" refer to an electronic device having a portion of which may be folded, wound, rolled, or received in a housing as the display is bent and deformed. The foldable electronic device and/or the rollable electronic device allows for expansion and use of the screen display area by unfolding the display or exposing a larger area of the display to the outside according to the user's need.

Figure 5:
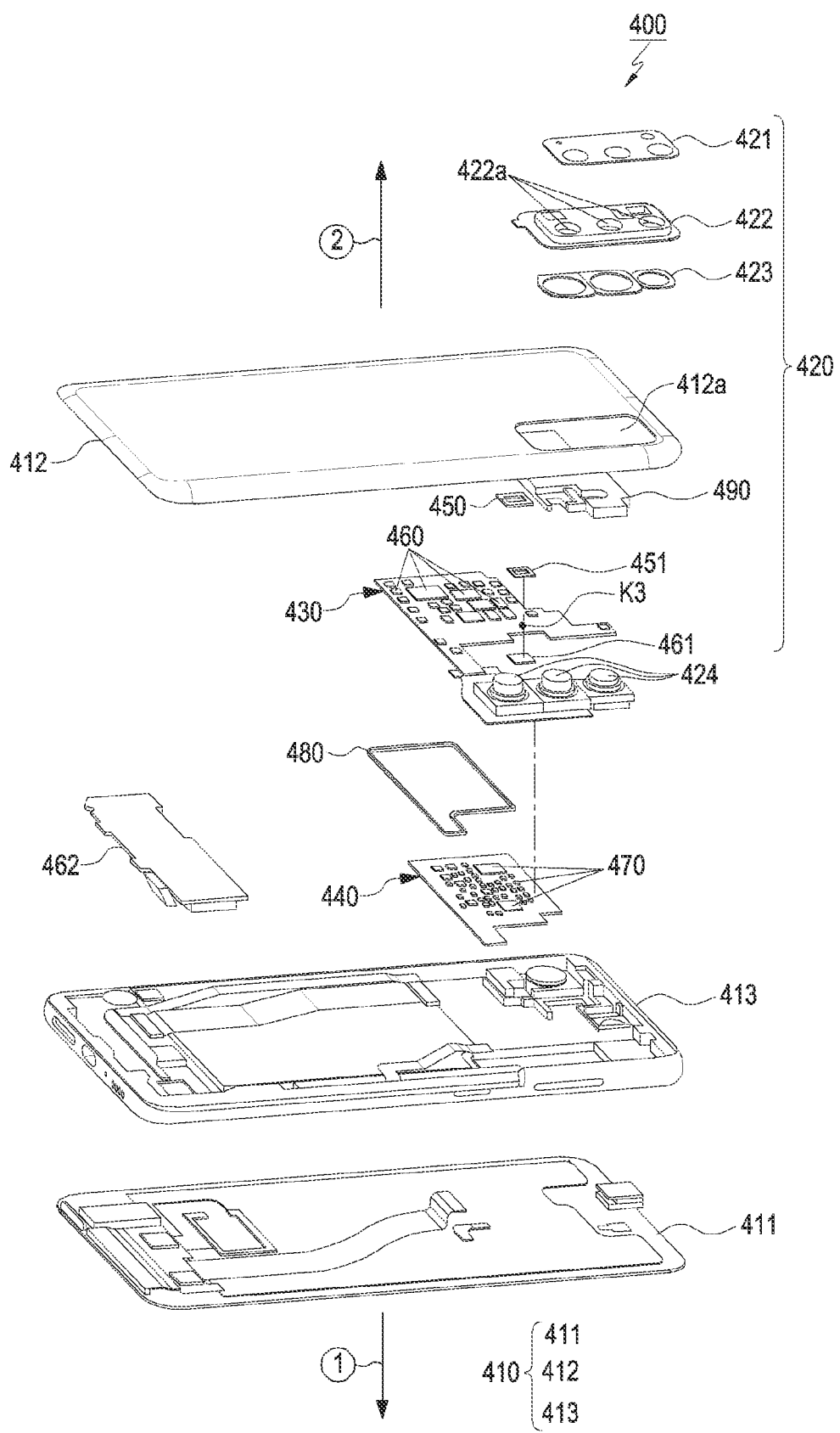
FIG. 5 is a diagram illustrating an exploded perspective view of a configuration of an electronic device, according to an embodiment.
Figure 6:
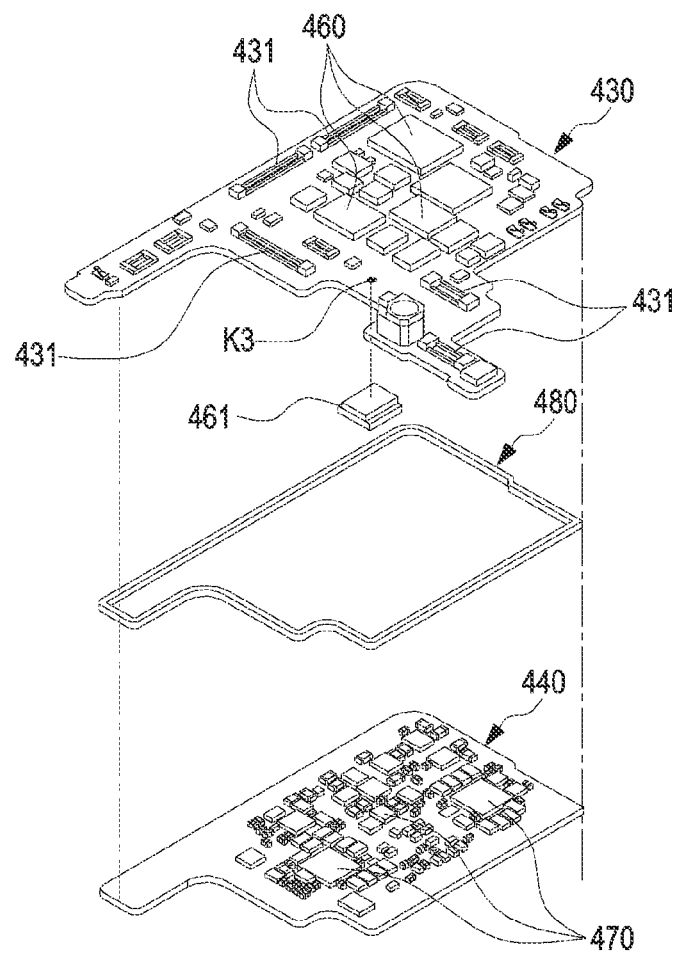
FIG. 6 is a diagram illustrating a perspective view of a first circuit board, a second circuit board, and an interposer, among the components of an electronic device, according to an embodiment.

FIG. 5 is a diagram illustrating an exploded perspective view of a configuration of an electronic device, according to an embodiment. FIG. 6 is a diagram illustrating a perspective view of a first circuit board, a second circuit board, and an interposer, among the components of an electronic device, according to an embodiment.

An electronic device 400 of FIGS. 5 and 6 may be at least partially similar to the electronic device 101 of FIG. 1 or may include another embodiment of the electronic device.

Referring to FIGS. 5 and 6, the electronic device 400 includes a housing 410, a camera module 420 including a camera deco 422, a first circuit board 430 a second circuit board 440, a flash 490, a first sealing member 450, a second sealing member 451, a first component 460, a second component 470, an interposer 480, and a speaker module 462 including a speaker. The housing 410 includes a first plate 411 facing in a first direction ①, a display, a second plate 412 facing in a second direction ② opposite to the first direction, and a side member 413 surrounding a space between the first plate 411 and the second plate 412. There may be provided a plurality of first components 460 and/or a plurality of second components 470.

The camera module 420 includes a camera window 421, a camera deco 422, a deco sealing member 423, and a plurality of cameras 424. For example, the camera deco 422 may be disposed on at least one of the first plate 411 and the second plate 412. The camera deco 422 may be disposed in a camera hole 412a formed in at least a portion of the second plate 412. For example, the camera deco 422 may be disposed separately from at least a portion of the side member 413 or may be integrally formed with the side member 413.

The camera window 421 may be disposed on the front surface of the camera deco 422, and the plurality of cameras 424 may be disposed on the rear surface of the camera deco 422. The plurality of cameras 424 may be fitted into a plurality of coupling holes 422a formed in the camera deco 422. For example, the plurality of cameras 424 may protrude from the surface of the second plate 412 by a predetermined height. The deco sealing member 423 may be disposed between the camera deco 422 and the plurality of cameras 424.

The flash 490 may be spaced apart from the camera deco 422 in a neighboring position. For example, the flash 490 may be disposed in the second plate 412 and may be disposed in a flash hole 491 formed in the second plate 412. A through hole (see 492 of FIG. 11B) connected with the flash hole 491 may be formed in the flash 490. A passage (see 493 of FIG. 11B) for moving an external sound (see L1 of FIG. 11B) may be formed between the through hole (see 492 of FIG. 11B) and the flash hole 491. For example, the external sound (see L1 of FIG. 11B) may be introduced into the housing 410 through a gap formed between the flash hole 491 and the flash 490.

The first circuit board 430 and the second circuit board 440 may be disposed to overlap at least a partial area of the flash 490 when viewed in the first direction ① The first circuit board 430 and the second circuit board 440 may be stacked on the rear surface of the second plate 412 toward the inside of the housing 410. For example, the first circuit board 430 may be disposed on the rear surface of the second plate 412, and the second circuit board 440 may be disposed to be spaced apart from the rear surface of the first circuit board 430.

The first circuit board 430 and/or the second circuit board 440 may be disposed on at least one of the first plate 411, the second plate 412, or a mid plate (e.g., a bracket). For example, the second circuit board 440 may be disposed on a first surface of the mid plate, and the interposer 480 may be disposed between the second circuit board 440 and the first circuit board 430.

The first circuit board 430 and/or the second circuit board 440 may be a PCB formed of a material (e.g., FR4) having non-bendable characteristics or may be a FPCB having bendable/flexible characteristics. For example, the first circuit board 430 and/or the second circuit board 440 may include an area (hereinafter, referred to as a "flexible area") having a bendable or flexible property. The flexible area may include a base film (or substrate) and a copper clad layer. For example, the flexible area may be a flexible copper clad layer (FCCL) in which at least one copper clad is stacked on at least a portion of at least one of an upper end or a lower end of a polyimide film.

The first sealing member 450 may be disposed in the position of at least a portion between the second plate 412 and the flash 490. The first sealing member 450 may be disposed between the rear surface of the second plate 412 and the front surface of the flash 490. For example, the first sealing member 450 may prevent the escape of the external sound (see L1 of FIG. 11B) introduced through the flash hole (see 491 of FIG. 11B) formed in the second plate 412.

The passage (see 493 of FIG. 11B) for moving the external sound (see L1 of FIG. 11B) introduced through the flash hole (see 491 of FIG. 11B) to the through hole 492 may be formed between the flash hole (see 491 of FIG. 11B) of the second plate 412 and the through hole (see 492 of FIG. 11B) of the flash 490. For example, the external sound L1 may be introduced through the flash hole 491 and may be transferred to the through hole 492 through the passage 493. The external sound L1 transmitted through the through hole 492 may pass through a sealing hole (451a of FIG. 11B) of the second sealing member 451 to be described below. In this case, when the external sound (L1 of FIG. 11B) passes through the passage 493, the first sealing member 450 may prevent the external sound (L1 of FIG. 11B) from escaping from the passage 493. For example, the first sealing member 450 may prevent sound leakage of the external sound (L1 of FIG. 11B).

Further, the first sealing member 450 may include a double-sided tape. For example, the double-sided tape may attach the rear surface of the second plate 412 to the front surface of the flash 490. For example, the double-sided tape may attach and fix the flash 490 to the rear surface of the second plate 412.

As such, as the first sealing member 450 is disposed on at least a portion of the flash 490 between the rear surface of the second plate 412 and the front surface of the flash 490, the first sealing member 450 may prevent escape (e.g., sound leakage) of the external sound L1 introduced through the flash hole 491 formed in the second plate 412. The first sealing member 450 including a double-sided tape may attach and fix the flash 490 to the second plate 412.

The second sealing member 451 may be disposed between the camera deco 422 and at least one of the first circuit board 430 and the second circuit board 440. The second sealing member 451 may be disposed between the rear surface of the flash 490 and the front surface of the first circuit board 430. For example, the second sealing member 451 may block entry of foreign substances through the flash hole 491 formed in the second plate 412. The second sealing member 451 may absorb the vibration generated due to the external sound L1 introduced from the outside of the flash hole 491.

A sealing hole (see 451*a* of FIG. 11B) through which the external sound L1 is introduced may be formed in the second sealing member 451, and a waterproofing member (see 451*b* of FIG. 11B) that blocks the external foreign substances may be included in the sealing hole 451*a*. For example, the waterproofing member 451*b* may include a mesh net.

In this way, as the second sealing member 451 is disposed on at least a portion of the rear surface of the flash 490 and the front surface of the first circuit board 430, the second sealing member 451 may block external foreign substances, provide waterproofing, and reduce damage caused by external influences (e.g., vibration caused by the external sound L1), thereby further enhancing the sealing capability of the second sealing member 451.

The first sealing member 450 or the second sealing member 451 may include a filling member, and the filling member may include at least one of silicon, rubber, latex, polyethylene terephthalate (PET), polyethylene (PE), Talon, or thermoplastic polyurethane (TPU). The material of the first sealing member 450 or the second sealing member 451 is described as including the above-described materials, as an example, but is not limited thereto. For example, as the material of the first sealing member 450 or the second sealing member 451, various materials may be used which may block foreign substances entering the housing 410 of the electronic device 400 and absorb vibration.

The first component 460 and the second component 470 may be disposed on at least a portion of the first circuit board 430 and/or at least a portion of the second circuit board 440. For example, both the first component 460 and the second component 470 may be disposed on at least a portion of the first circuit board 430, both the first component 460 and the second component 470 may also be disposed on at least a portion of the second circuit board 440, or the first component 460 may be disposed on at least a portion of the first circuit board 430 while the second component 470 may be disposed on at least a portion of the second circuit board 440. Conversely, the first component 460 may be disposed on at least a portion of the second circuit board 440 while the second component 470 may be disposed on at least a portion of the first circuit board 430.

Both the first component 460 and the second component 470 may be disposed on at least a portion of the first circuit board 430, and in this state, at least one of the first component 460 and the second component 470 may be disposed on at least a portion of the second circuit board 440. For example, both the first component 460 and the second component 470 may be disposed on at least a portion of the first circuit board 430, and the first component 460 may be disposed on at least a portion of the second circuit board 440. Further, both the first component 460 and the second component 470 may be disposed on at least a portion of the first circuit board 430, and the second component 470 may be disposed on at least a portion of the second circuit board 440. Further, both the first component 460 and the second component 470 may be disposed on at least a portion of the second circuit board 440, and the first component 460 may be disposed on at least a portion of the first circuit board 430. Both the first component 460 and the second component 470 may be disposed on at least a portion of the second circuit board 440, and the second component 470 may be disposed on at least a portion of the first circuit board 430.

The first component 460 and the second component 470 include at least one of a microphone 461, a speaker, a memory card, a processor, a plurality of sensors, an antenna, a plurality of connectors, an inductor, an active element, a passive element, and a circuit element. As shown in FIG. 5, the first component 460 and the second component 470 are provided as an example, but they are not limited thereto. For example, other components included in the electronic device 400 may be applied as the first component 460 and the second component 470. Further, the first component 460 and the second component 470 may be heat generation sources that generate heat, and may be at least one of a power management integrated circuit (PMIC), a power amplifier (PAM), an application processor (AP), a communication processor (CP), a charger integrated circuit (IC), or a display driver integrated circuit (DDI)). A shielding structure (or a "shield can") may be included in at least a portion of the first circuit board 430 and/or the second circuit board 440 to protect the first component 460 and the second component 470. For example, the shielding structure may be formed of a conductive material (e.g., metal) and may electromagnetically shield the first component 460 and the second component 470.

The first component 460, the second component 470, the interposer 480, the first sealing member 450, and the second sealing member 451 are disposed on the flash 490 disposed on the second plate 412. For example, the first component 460, the second component 470, the interposer 480, the first sealing member 450, and the second sealing member 451 may be disposed on at least a portion of a first area C1 where the camera deco 422 is disposed. Further, the first component 460, the second component 470, the interposer 480, the first sealing member 450, and the second sealing member 451 may be disposed in a second area C2 where the camera deco 422 is absent. A structure in which the first component 460, the second component 470, the interposer 480, the first sealing member 450, and the second sealing member 451 are disposed on at least a portion of the first area C1 where the flash 490 is disposed, is described in greater detail below.

The interposer 480 is disposed between the first circuit board 430 and the second circuit board 440 and may electrically connect the first circuit board 430 and the second circuit board 440. For example, the interposer 480 is disposed between the first circuit board 430 and the second circuit board 440 while simultaneously forming an arrangement space (see 481 of FIG. 11B) for disposing the first component 460 and the second component 470 between the first circuit board 430 and the second circuit board 440. The first component 460, the second component 470, and wiring electrically connecting the first component 460 ad the second component 470 may be placed in the arrangement space 481.

The interposer 480 may be disposed along the outer periphery of the first circuit board 430 and the second circuit board 440. Thus, by forming the arrangement space (see 481 of FIG. 11B) for disposing the first component 460 and the second component 470 in the interposer 480, the first circuit board 430 and the second circuit board 440 may dispose the first component 460 and the second component 470 in the arrangement space 481 to thereby efficiently use the space inside the electronic device 400. The interposer 480 may have a copper clad laminate (CCL) structure including a plurality of preimpregnated (PREPREG, PPG) materials layers (e.g., insulating resin layers) and a copper clad disposed therebetween.

By distributing the first components 460 and/or the second components 470 on the first circuit board 430 and/or the second circuit board 440, the first circuit board 430 and/or the second circuit board 440 may secure a broad surface area for disposing the first component 460 and/or the second component 470, and the size of the first circuit board 430 and/or the second circuit board 440 may be reduced, contributing to miniaturization of the electronic device 400.

Figure 7:
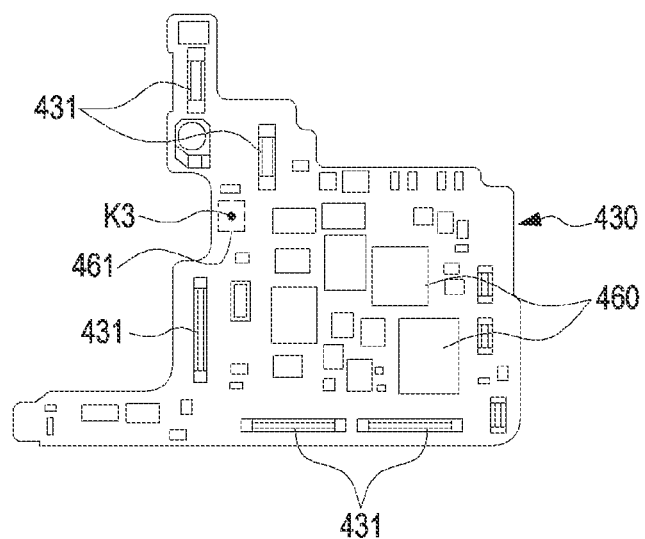
FIG. 7 is a diagram illustrating a plan view of a first circuit board among the components of an electronic device, according to an embodiment.
Figure 8:
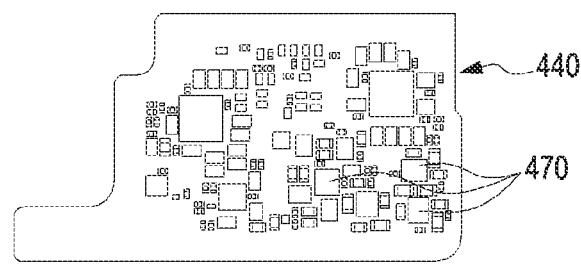
FIG. 8 is a diagram illustrating a plan view of a second circuit board, among the components of an electronic device, according to an embodiment.
Figure 9:
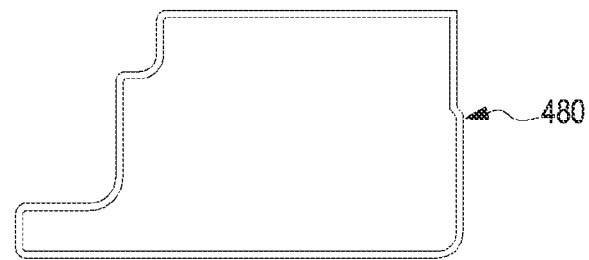
FIG. 9 is a diagram illustrating a plan view of an interposer, among the components of an electronic device, according to an embodiment.

FIG. 7 is a diagram illustrating a plan view of a first circuit board, among the components of an electronic device, according to an embodiment. FIG. 8 is a diagram illustrating a plan view of a second circuit board, among the components of an electronic device, according to an embodiment. FIG. 9 is a diagram illustrating a plan view of an interposer, among the components of an electronic device, according to an embodiment.

Referring to FIGS. 7 to 9, the size of the first circuit board 430 may be smaller than the size of the second circuit board 440. Conversely, the size of the first circuit board 430 may be larger than the size of the second circuit board 440. Or, the size of the first circuit board 430 may be the same as the size of the second circuit board 440.

The first circuit board 430 or the second circuit board 440 may include a slave PCB or a primary or master PCB. The first circuit board 430 may include a slave PCB. The second circuit board 440 may include a primary or master PCB.

A structure in which the size of the first circuit board 430 (e.g., a slave PCB) is larger than the size of the second circuit board 440 (e.g., a master PCB) is described in greater detail below.

For example, the first circuit board 430 (e.g., a slave PCB) has a plurality of connectors 431 to electrically connect the first component 460 disposed on the first circuit board 430 with another component. For example, the size of the first circuit board 430 may be larger than the size of the second circuit board 440 (e.g., a master PCB) to have the plurality of connectors 431. Further, since the second circuit board 440 has the second component 470 (e.g., a processor) having a high wiring density disposed thereon so that there is no need for the plurality of separate connectors 431 for electrically connecting with other external components, the second circuit board 440 may be formed to be smaller in size than the first circuit board 430.

The size of the interposer 480 may be smaller than or equal to the size of the first circuit board 430 and the second circuit board 440. The size of the interposer 480 may be the same as the size of the second circuit board 440. For example, the interposer 480 may be manufactured overall in a closed loop shape, and the interposer 480 may be formed in a constant thickness.

A first surface of the interposer 480 may be electrically connected to the rear surface of the first circuit board 430, and a second surface of the interposer 480, which is opposite to the first surface, may be electrically connected to the front surface of the second circuit board 440.

The interposer 480 may be disposed along the outer periphery of the first circuit board 430 and the second circuit board 440.

As such, as the interposer 480 electrically connecting the first circuit board 430 and the second circuit board 440 is disposed between the first circuit board 430 and the second circuit board 440. The first component 460 and/or the second component 470 may be distributed on the first circuit board 430 and/or the second circuit board 440, respectively, so that the first circuit board 430 and/or the second circuit board 440 may secure a wide surface area for disposing the first component 460 and/or the second component 470. Efficiency in mounting in the electronic device may be enhanced.

Figure 10:
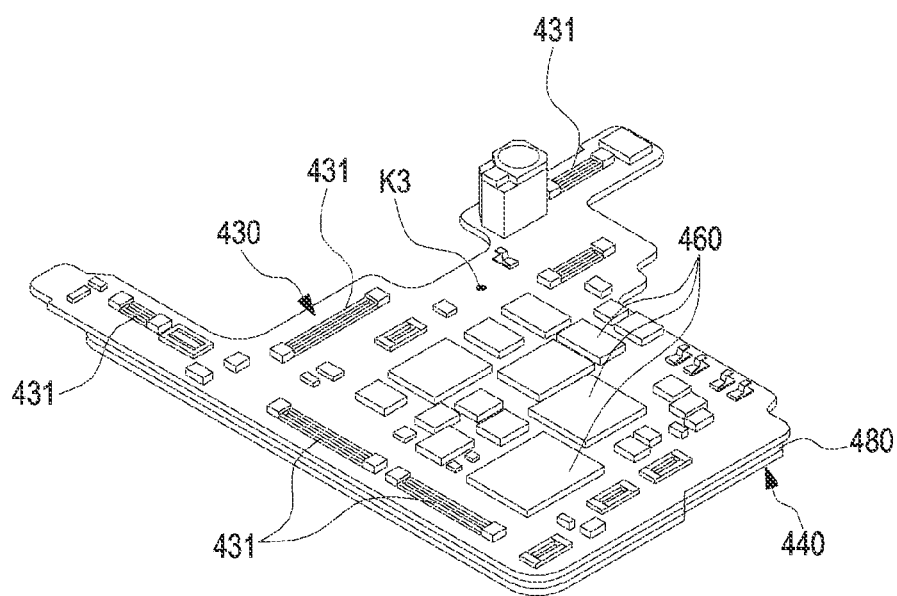
FIG. 10 is a diagram illustrating a perspective view of a coupled state of a first circuit board, a second circuit board, and an interposer, among the components of an electronic device, according to an embodiment.
Figure 11A:
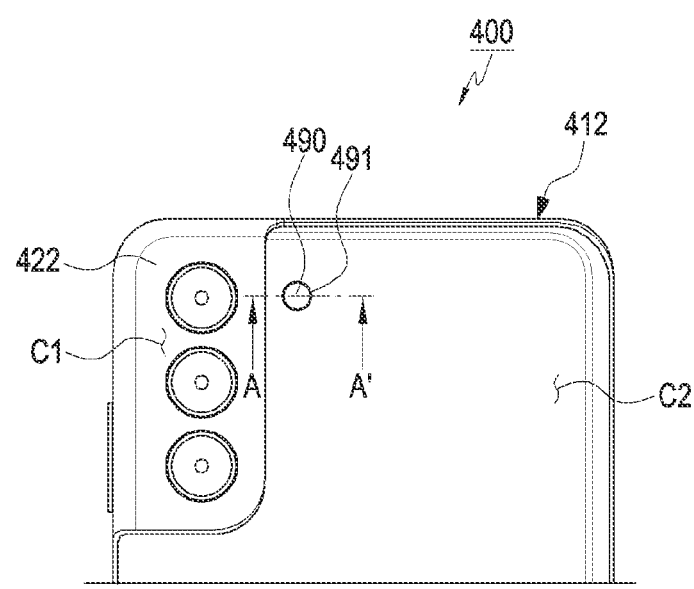
FIG. 11A is a diagram illustrating a plan view of a coupled state of components of an electronic device, according to an embodiment.
Figure 11B:
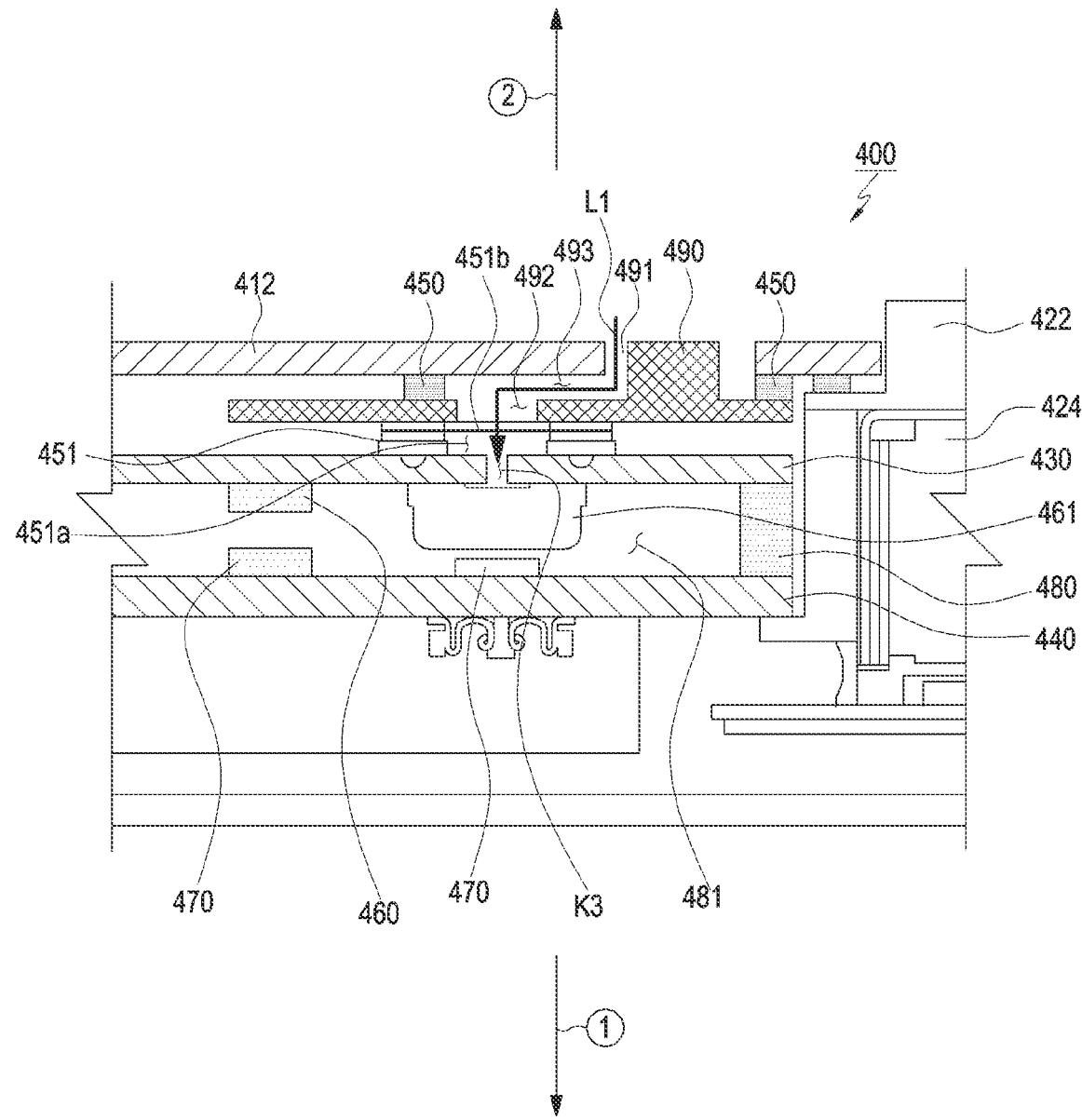
FIG. 11B is a diagram illustrating a side cross-sectional view taken along line A-A' of FIG. 114, illustrating a coupled state of components of an electronic device, according to an embodiment.

FIG. 10 is a diagram illustrating a perspective view of a coupled state of a first and second circuit boards and an interposer, among the components of an electronic device, according to an embodiment. FIG. 11A is a diagram illustrating a plan view of a coupled state of components of an electronic device, according to an embodiment. FIG. 11B is a diagram illustrating a side cross-sectional view taken along line A-A' of FIG. 11A, illustrating a coupled state of components of an electronic device, according to an embodiment.

Referring to FIGS. 10 and 11A and 11B, the electronic device 400 includes the housing 410, the camera module 420 including the camera deco 422, the first circuit board 430, the second circuit board 440, the flash 490, the first sealing member 450, the second sealing member 451, the first component 460 including the microphone 461, the second component 470, and the interposer 480. For example, the housing 410 may include the first plate 411 facing in the first direction ① and the second plate 412 facing in the second direction ② opposite to the first direction.

The flash hole 491 may be formed in at least some position of the second plate 412, and the flash 490 may be disposed in the flash hole 491. For example, the flash 490 may be disposed on the rear surface of the second plate 412 and may simultaneously be disposed in the flash hole 491. The first sealing member 450 may be disposed between the second plate 412 and the flash 490, and the second sealing member 451 may be disposed between the flash 490 and the first circuit board 430. The interposer 480 may be disposed between the first circuit board 430 and the second circuit board 440. For example, the first component 460 including a microphone may be disposed on the first circuit board 430, and the second component 470 may be disposed on the second circuit board 440. The second circuit board 440 may be spaced apart from the first circuit board 430 using the interposer while the first and second circuit boards 430 and 440 may simultaneously be electrically connected by the interposer 480. In this case, the arrangement space 481 may be formed between the first and second circuit boards 430 and 440 by the interposer 480. The first component 460 including the microphone 461 and the second component 470 may be disposed in the arrangement space 481.

For example, an opening K3 facing the through hole 492 formed in the flash 490 may be formed in the first circuit board 430. The microphone 461 may be disposed in the opening K3. For example, since the passage 493 for moving the external sound L1 is formed between the flash hole 491 and the through hole 492, the passage 493 may be connected with the opening K3. in this state, the external sound L1 introduced through the passage 493 may pass through the sealing hole 451*a* of the second sealing member 451 and the opening K3 to the microphone 461.

The microphone 461 may convert the received external sound L1 into an electrical signal.

The external sound L1 may be introduced through a gap formed between the flash hole 491 and the flash 490, and the introduced external sound L1 may be transferred through the passage 493 and the opening K3 to the microphone 461. In this case, the external sound L1 may be prevented from escaping from the passage 493 by the first sealing member 450 disposed between the second plate 412 and the flash 490. Due to this, the transfer of the external sound L1 to the microphone 461 may be enhanced by the first sealing member 450.

The first and second circuit boards 430 and 440 disposed on the rear surface of the flash 490 may be stacked by the interposer 480, and the arrangement space 481 may be simultaneously formed between the first and second circuit boards 430 and 440, and a plurality of components other than the microphone 461 may be disposed in the arrangement space 481. Thus, it is possible to more efficiently use the internal space of the electronic device.

Figure 12A:
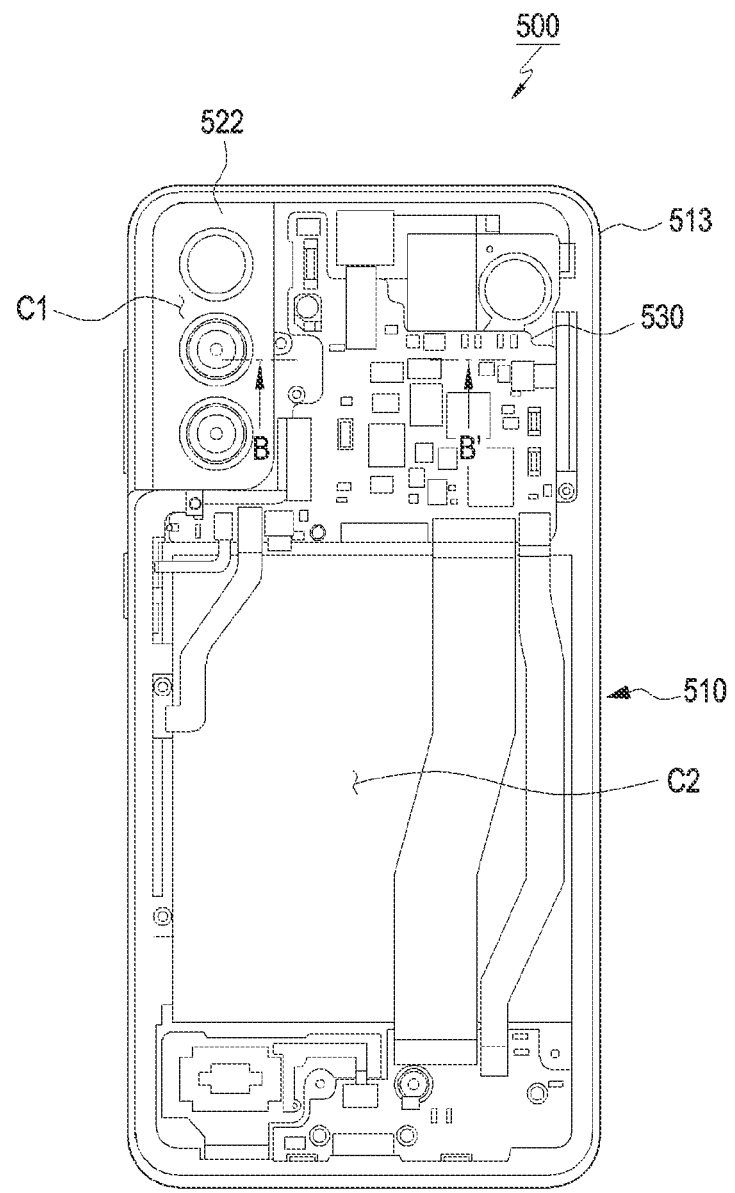
FIG. 12A is a diagram illustrating a plan view of a coupled state of components of an electronic device, according to an embodiment.
Figure 12B:
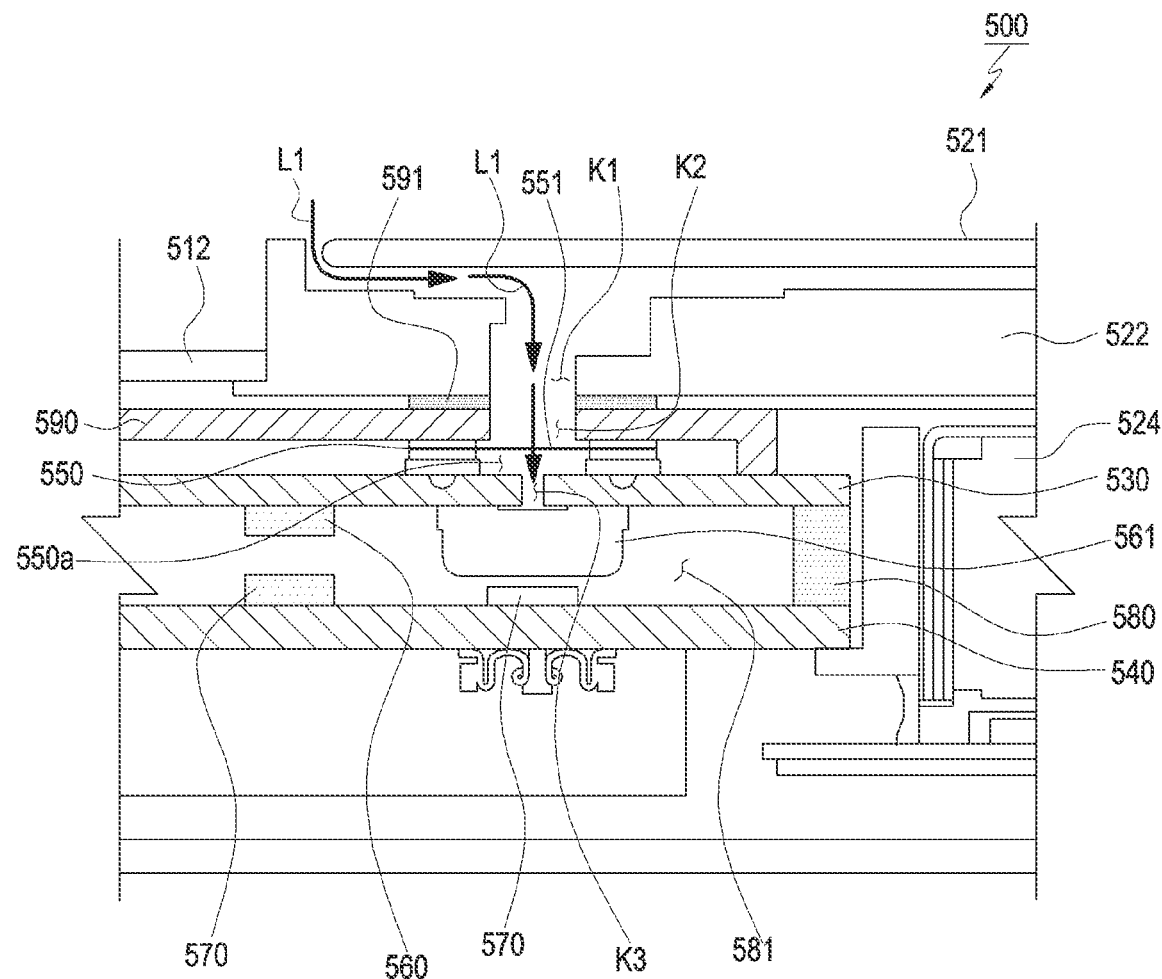
FIG. 12B is a diagram illustrating a side cross-sectional view taken along line B-B' of FIG. 12A, illustrating a coupled state of components of an electronic device, according to an embodiment.

FIG. 12A is a diagram illustrating a plan view of a coupled state of components of an electronic device, according to an embodiment. FIG. 12B is a diagram illustrating a side cross-sectional view taken along line B-B' of FIG. 12A, illustrating a coupled state of components of an electronic device, according to an embodiment.

Referring to FIGS. 12A and 12B, according to various embodiments, an electronic device 500 includes a housing 510, a side member 513, a camera module 520 including a camera deco 522, a camera window 521, and a plurality of cameras 524, a first circuit board 530, a second circuit board 540, a sealing member 550, a first component 560 including a microphone 561, a second component 570, and an interposer 580. For example, the housing 510 may include a first plate 511 facing in a first direction ① and a second plate 512 facing in a second direction ② opposite to the first direction.

The camera deco 522 may be disposed in the position of at least a portion of the second plate 512, and the sealing member 550 may be disposed in the position of at least a portion of the camera deco 522. The interposer 580 may be disposed between the first circuit board 530 and the second circuit board 540.

At least one of the components of the electronic device 500 may be the same or similar to at least one of the components of the electronic device 400 of FIG. 5 or FIG. 10 and duplicate descriptions are omitted.

The first component 560 or the second component 570 may be disposed on the first circuit board 530, and the first component 560 or the second component 570 may be disposed on the second circuit board 540. The second circuit board 540 may be disposed to be spaced apart from the first circuit board 530. In this state, the interposer 580 may be disposed between the first and second circuit boards 530 and 540, and the first and second circuit boards 530 and 540 may be electrically connected by the interposer 580. In this case, an arrangement space 581 may be formed between the first and second circuit boards 530 and 540 by the interposer 580. The first component 560 and the second component 570 may be disposed in the arrangement space 581.

For example, the sealing member 550 may be disposed on at least the portion of the first and second circuit boards 530 and 540 on which the interposer 580 is disposed. For example, the sealing member 550 may be disposed around the third opening K3 formed in the first circuit board 530. The third opening K3 and a sealing hole 550a formed in the sealing member 550 may face each other. The sealing hole 550a may face a second opening K2 formed in a cover case 590. The second opening K2 may face a first opening K1 formed in the camera deco 522. For example, the first opening K1 of the camera deco 522 may face the second opening K2 of the cover case 590, the second opening K2 may face the sealing hole 550a of the sealing member 550, the sealing hole 550a may face a third opening K3 of the first circuit board 530. In this state, the external sound L1 introduced from the outside of the camera deco 522 may pass through the first and second openings K1 and K2, then the sealing hole 550a, and then the third opening K3. The third opening K3 may be disposed to face at least one of the microphone 561 and a speaker.

The third opening K3 may be disposed to face the microphone 561. Accordingly, the external sound L1 transmitted through the first and second openings K1 and K2 and the sealing hole 550a may be transferred through the third opening K3 to the microphone 561. The microphone 561 may convert the received external sound L1 into an electrical signal.

As the sealing member 550 is disposed on at least a portion of the camera deco 522 that is not affected by vibration generated by introduction of the external sound L1, the sealing member 550 may reduce damage caused by vibration, thereby further enhancing the sealing capability of the sealing member 550.

A cover sealing member 591 for blocking a gap formed between the camera deco 522 and the cover case 590 may be disposed between the camera deco 522 and the cover case 590. The cover sealing member 591 may prevent escape of the external sound L1 through a gap formed between the camera deco 522 and the cover case 590. For example, the cover sealing member 590 may include at least one of an adhesive member, a double-sided tape, or a waterproofing member.

In the absence of the cover case 590, the rear surface of the camera deco 522 may directly face the upper surface of the sealing member 550. For example, the sealing member 550 may prevent escape of the external sound L1 through a gap formed between the camera deco 522 and the first circuit board 530.

Further, the interposer 580 may be disposed between the first and second circuit boards 530 and 540. The interposer 580 may secure an arrangement space 581 for disposing the first component 560 and the second component 570 between the first circuit board 530 and the second circuit board 540. Accordingly, it is possible to further efficiently use the internal space of the electronic device 500 by disposing the first component 560 and the second component 570 in the arrangement space 581.

The conventional first or second circuit board may be formed in a different size or shape to have the first component 560 and the second component 570 (e.g., the microphone 561, a speaker, an antenna, and an antenna connector) disposed thereon. For example, since the conventional first or second circuit board need to provide a separate space for disposing the first component 560 and the second component 570, the conventional first or second circuit board may be cut or enlarged. The conventional first or second circuit board in a different shape or size has a disadvantage of being unable to be disposed in the electronic device 500 that may come in various sizes or shapes. Thus, the conventional first or second circuit board may inhibit common use, as a common component, in the electronic device 500.

To address such drawbacks of the conventional first and second circuit boards, in the present embodiment, as the first circuit board 530 and the second circuit board 540 are formed in the same or similar sizes, the first circuit board 530 and the second circuit board 540 may be formed in a constant size and shape. Further, as described above in connection with FIG. 10, the interposer 580 may be disposed between the first circuit board 530 and the second circuit board 540. For example, the first, circuit board 530 and the second circuit board 540 may be coupled to each other to be modularized using the interposer 580. For example, the first circuit board 530 (e.g., a slave PCB) may have a plurality of connectors (e.g., the plurality of connectors 431 of FIG. 10) to electrically connect the first component 560 disposed on the first circuit board 530 (e.g., a slave PCB) with another component. The shape of the first component 560 may be changed according to the size and shape of the component set. Accordingly, the shape of the first circuit board 530 may be changed according to the size and shape of the plurality of connectors (e.g., the plurality of connectors 431 of FIG. 10) and the set of the first components 560. Further, the second circuit board 540 (e.g., a master PCB) may have the second component 570 (e.g., a processor) with a high wiring density disposed thereon. For example, the second component 570 may be formed as a single component. Thus, since the shape of the second circuit board 540 may be formed without influence by the shape of the component set, it may be formed to be smaller than the shape of the first circuit board 530.

As shown in FIG. 12A, the modularized first circuit board 530 and second circuit board 540 may be disposed in the electronic device 500 having various sizes or shapes. For example, the modularized first circuit board 530 and second circuit board 540 may be used as common components in various electronic devices 500 having different sizes or shapes. As the modularized first circuit board 530 and second circuit board 540 are rendered to be commonly used as common components in various electronic devices 500, it is possible to simplify the assembly process of the product, eliminate the need for cutting the first circuit board 530 and the second circuit board 540 to thus save manufacturing costs, and further efficiently use the internal space of the electronic device 500.

Figure 13:
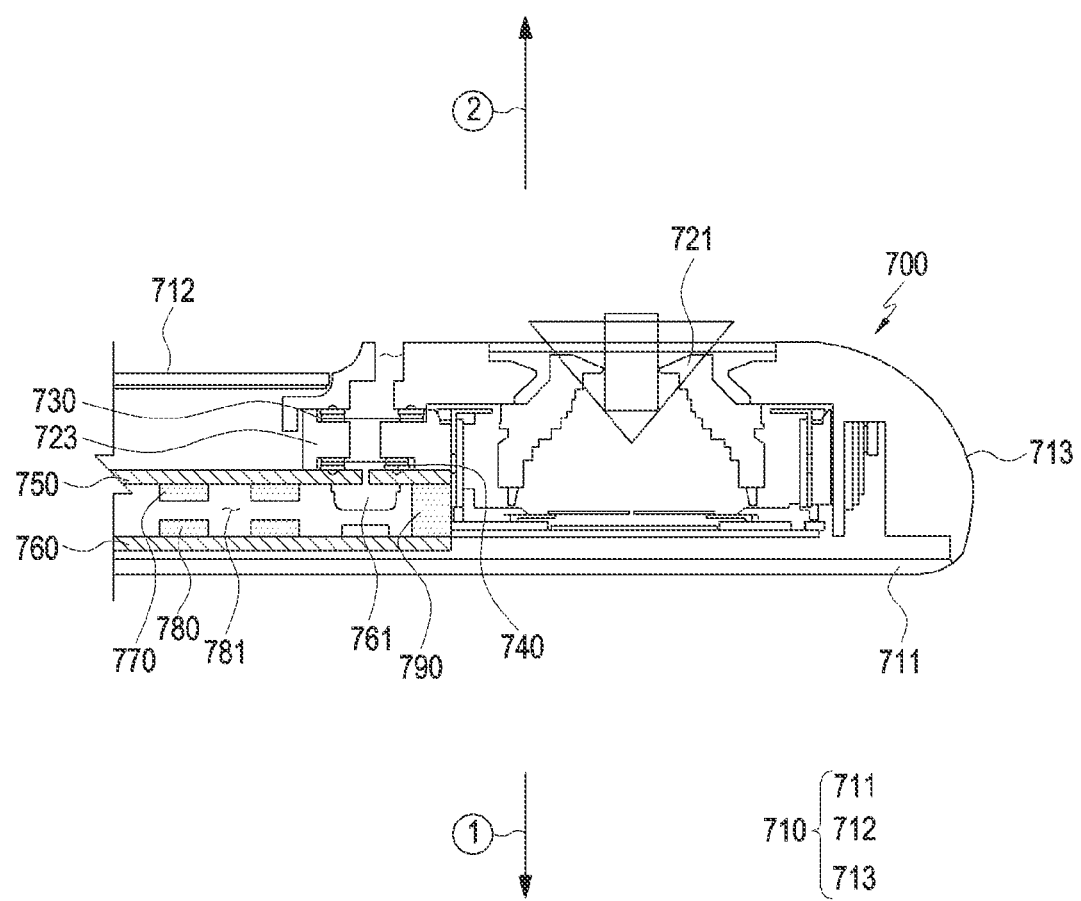
FIG. 13 is a diagram illustrating a side cross-sectional view of a coupled state of components of an electronic device, according to another embodiment.

FIG. 13 is a diagram illustrating a side cross-sectional view of a coupled state of components of an electronic device, according to an embodiment.

An electronic device 700 includes a housing 710, a plurality of cameras 721, a first sealing member 730, a second sealing member 740, a first circuit board 750, a second circuit board 760, a first component 770 including a microphone 761, and a second component 780. For example, the housing 710 may include a first plate 711 facing a first direction ①, a display (e.g., the display 330 of FIG. 4), a second plate 712 facing a second direction ②, opposite to the first direction ①, and a side member 713 surrounding a space between the first plate 711 and the second plate 712. There may be provided a plurality of first components 770 and a plurality of second components 780.

Referring to FIG. 13, at least one of the components of the electronic device 700 may be the same or similar to at least one of the components of the electronic device 500 of FIGS. 12A and 12B and duplicate descriptions are omitted.

The first circuit board 750 and the second circuit board 760, spaced apart from the first circuit board 750, may be disposed in an area adjacent to the plurality of cameras 721. The first component 770 may be disposed on the first circuit board 750, and the second component 780 may be disposed on the second circuit board 760. The interposer 790 may be disposed between the first and second circuit boards 750 and 760, and the first and second circuit boards 750 and 760 may be electrically connected by the interposer 790. In this case, an arrangement space 781 may be formed between the first and second circuit boards 750 and 760 by the interposer 790. The first component 770 and the second component 780 may be disposed in the arrangement space 781.

The camera deco 723 may be disposed in the position of at least a portion of the second plate 712, and the first sealing member 730 and the second sealing member 740 may be disposed in the position of at least a portion of the camera deco 723. The first sealing member 730 may be disposed on an upper area of the camera deco 723, and the second sealing member 740 may be disposed on a lower area of the camera deco 723. As the first sealing member 730 and the second sealing member 740 are disposed on at least a portion of the camera deco 723, which is not influenced by the vibration generated due to introduction of an external sound, the first sealing member 730 and the second sealing member 740 may reduce damage due to vibration.

The camera deco 723 (and the first sealing member 730 and the second sealing member 740) may be disposed on one surface of the first circuit board 750 and/or the second circuit board 760. For example, the camera deco 723 sealed by the second sealing member 740 may be positioned on one surface facing the rear plate of the first circuit board 750, and the microphone 761 may be disposed on one surface facing in the direction opposite to the rear plate of the first circuit board 750. The camera deco 723 (and the first sealing member 730 and the second sealing member 740) may be disposed on the interposer 790.

Figure 14:
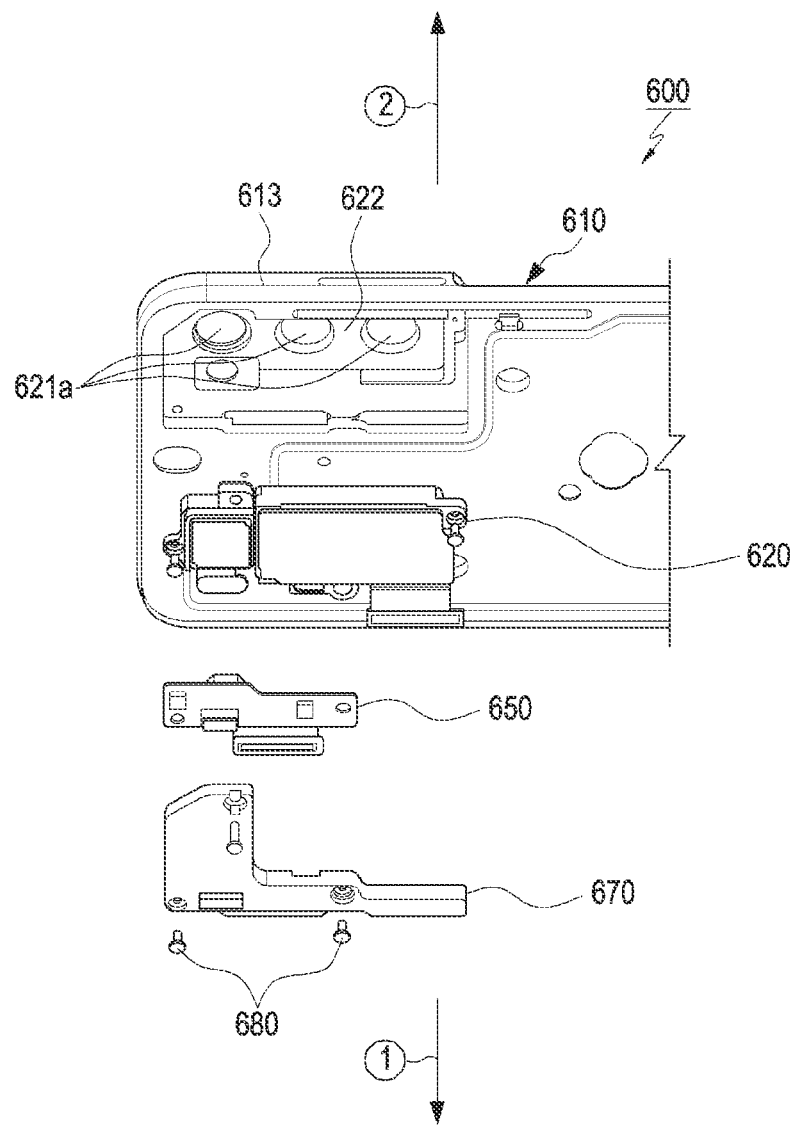
FIG. 14 is a diagram illustrating an exploded perspective view of a configuration of an electronic device, according to another embodiment.
Figure 15:
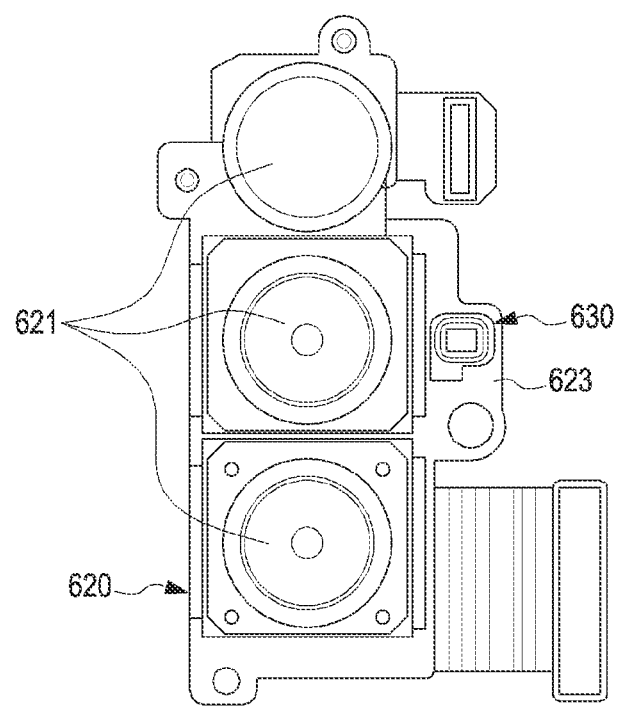
FIG. 15 is a diagram illustrating a plan view of a first sealing member, among the components of an electronic device, according to an embodiment.
Figure 16A:
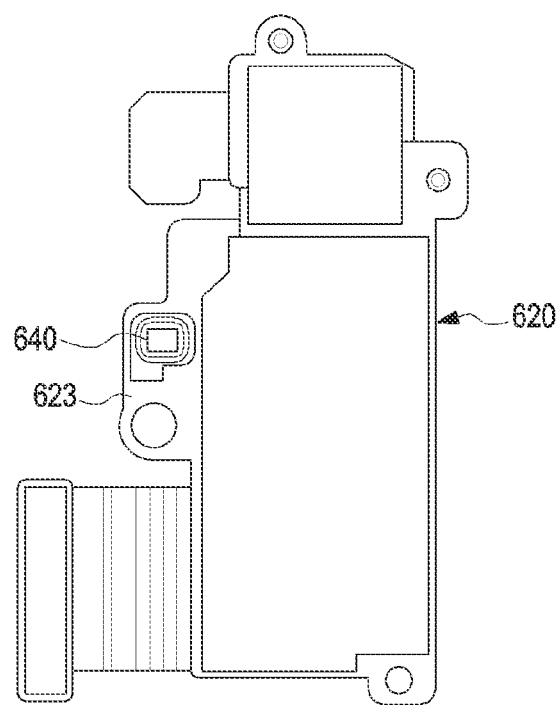
FIG. 16A is a diagram illustrating a bottom view of a second sealing member, among the components of an electronic device, according to another embodiment.
Figure 16B:
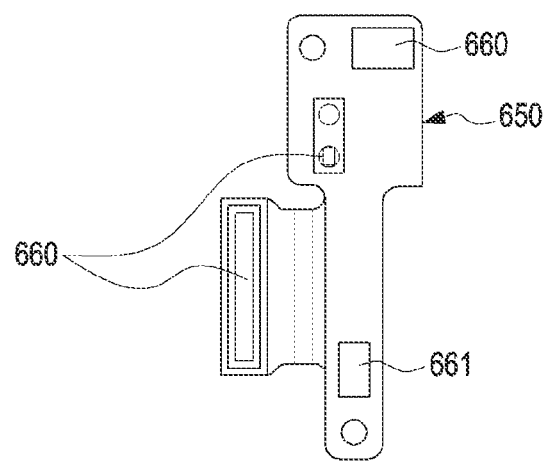
FIG. 16B is a diagram illustrating a bottom view of a circuit board, among the components of an electronic device, according to another embodiment.
Figure 17:
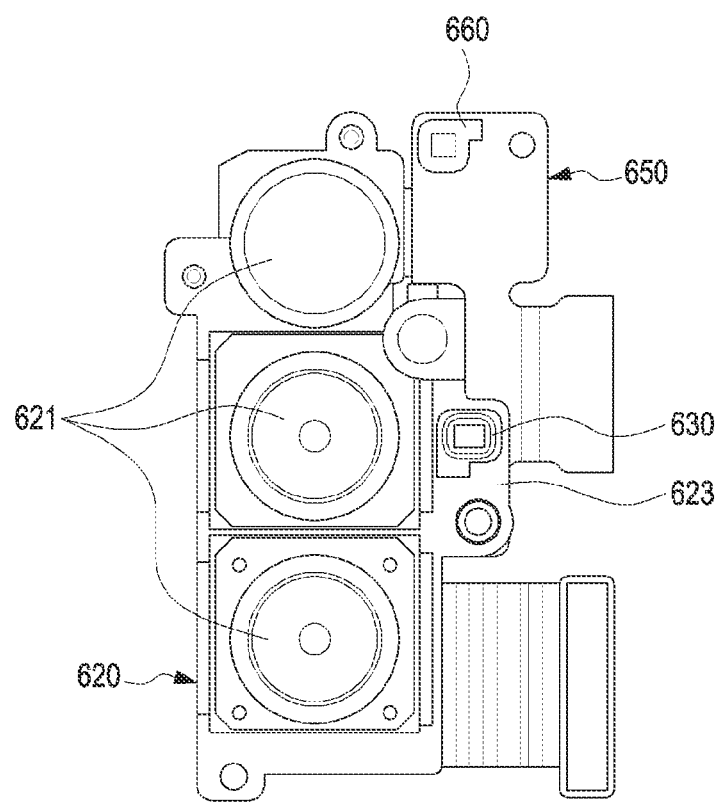
FIG. 17 is a diagram illustrating a plan view of a coupled state of a camera module, a first sealing member, and a circuit board, among the components of an electronic device, according to another embodiment.
Figure 18:
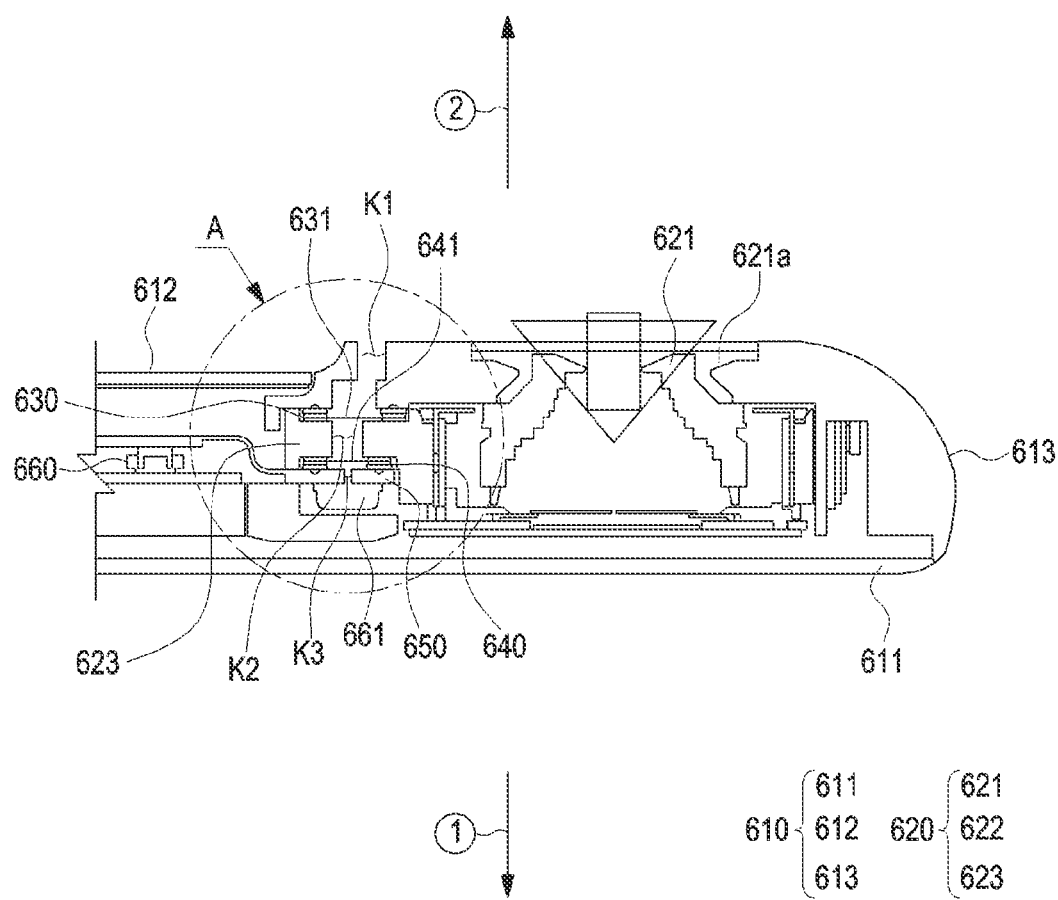
FIG. 18 is a diagram illustrating a side cross-sectional view of a coupled state of components of an electronic device, according to another embodiment.
Figure 19:
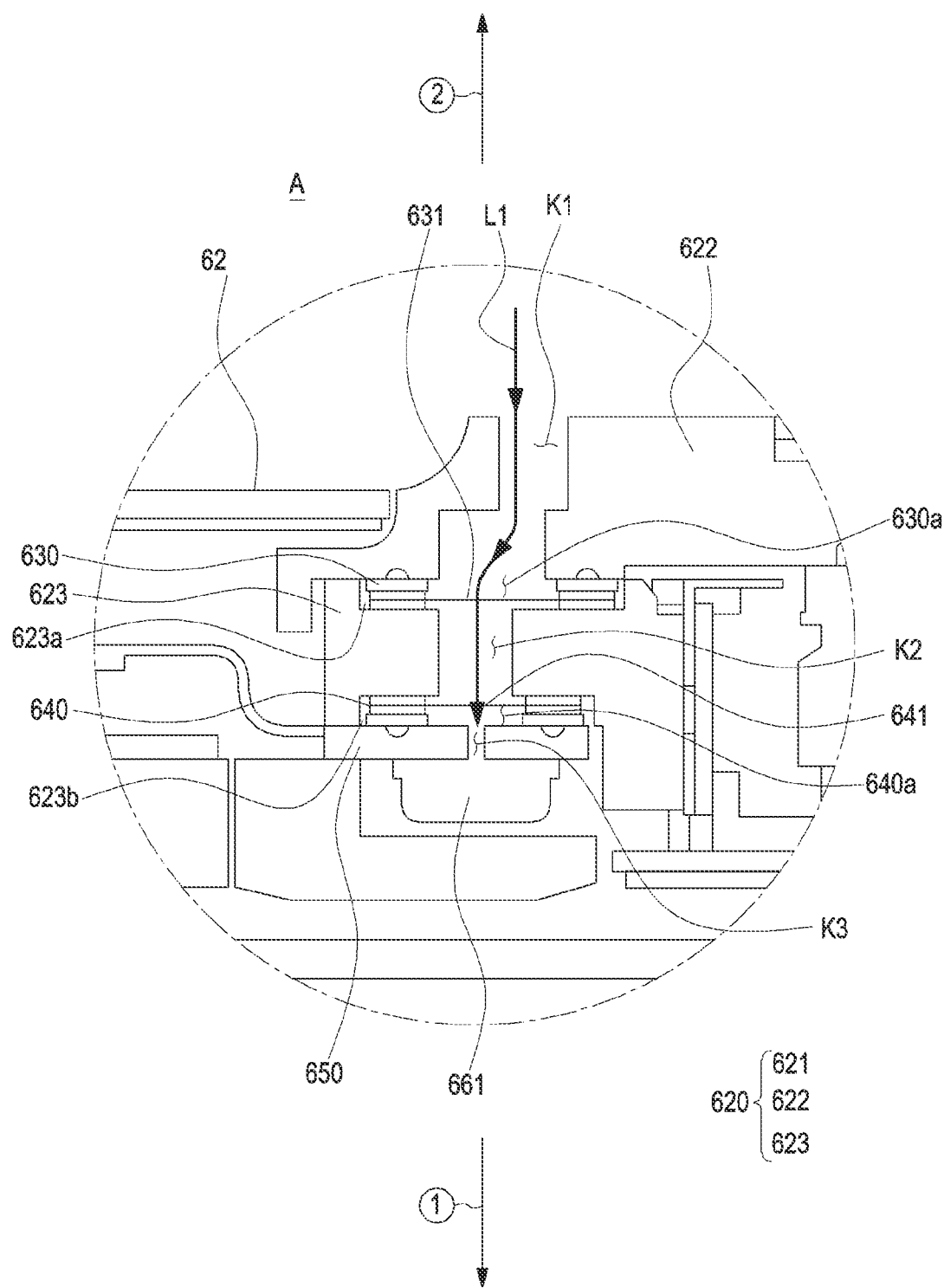
FIG. 19 is a diagram illustrating an enlarged side cross-sectional view of portion A of FIG. 18, according to an embodiment.

FIG. 14 is a diagram illustrating an exploded perspective view of a configuration of an electronic device, according to another embodiment. FIG. 15 is a diagram illustrating a plan view of a first sealing member, among the components of an electronic device, according to an embodiment. FIG. 16A is a diagram illustrating a bottom view of a second sealing member, among the components of an electronic device, according to another embodiment. FIG. 16B is a diagram illustrating a bottom view of a circuit board, among the components of an electronic device, according to another embodiment. FIG. 17 is a diagram illustrating a plan view of a coupled state of a camera module, a first sealing member, and a circuit board, among the components of an electronic device, according to another embodiment. FIG. 18 is a diagram illustrating a side cross-sectional view of a coupled state of components of an electronic device, according to another embodiment. FIG. 19 is a diagram illustrating an enlarged view of an area of FIG. 18, according to an embodiment.

Referring to FIGS. 14 to 17, an electronic device 600 has a structure without an interposer. The electronic device 600 includes a housing 610, a camera module 620, a plurality of cameras 621, a first sealing member 630, a second sealing member 640, a circuit board 650, and a component 660. For example, the housing 610 may include a first plate 611 (see FIG. 18) facing a first direction ①, a display (e.g., the display 330 of FIG. 4), a second plate 612 (see FIG. FIG. 18) facing a second direction ② opposite to the first direction ①, and a side member 613 (see FIG. 18) surrounding a space between the first plate 611 and the second plate 612. A plurality of components 660 may be provided.

The camera module 620 may include a camera deco 622, a plurality of cameras 621, and a camera flange 623. For example, the camera deco 622 may be integrally formed with at least a portion of the rear surface of the housing 610. For example, the camera deco 622 may be integrally formed with at least a portion of the side member 613 and may simultaneously be exposed to the outside. The plurality of cameras 621 may be visually exposed to the outside while being simultaneously coupled to a plurality of coupling holes 621a formed in the camera deco 622. In this case, a supporting member 670 and a screw 680 may be coupled to at least a portion of the camera deco 622 to support the plurality of cameras 621 while the plurality of cameras 621 are simultaneously disposed in the plurality of coupling holes 621a.

The camera flange 623 may be formed to protrude from at least a portion of the periphery of the camera module 620 to dispose the first sealing member 630 and the second sealing member 640, which are described in greater below. For example, the camera flange 623 may be formed to extend and protrude around the periphery of the camera module 620.

Referring to FIG. 18, a microphone may be disposed on the second surface of the circuit board 650. For example, the microphone may be disposed in at least a partial area of the camera deco 622, and the microphone may be formed in a microphone hole formed in the second surface of the circuit board 650. The second surface of the circuit board 650 may be one surface facing the first direction ① of the housing 610. Similarly, the microphone hole may also be disposed in at least a partial area of the camera deco 622. For example, the microphone hole may include a third opening K3 described below. The first sealing member 630 may be disposed between the camera deco 622 and the first surface of the camera flange 623. For example, the first surface of the camera flange 623 may face the second direction ② of the housing 610. The circuit board 650 may be disposed on a second surface opposite to the first surface of the camera flange 623. For example, the second surface of the camera flange 623 may face the first direction ① of the housing 610. The second sealing member 640 may be disposed between the second surface of the camera flange 623 and the first surface of the circuit board 650. The first surface of the circuit board 650 may face the second direction ② of the housing 610.

A first seating recess 623a for seating the first sealing member 630 may be formed in the first surface of the camera flange 623, and a second seating recess 623b for seating the second sealing member 640 may be formed in the second surface of the camera flange 623. For example, the first sealing member 630 may be inserted and seated in the first seating recess 623a formed in the first surface of the camera flange 623. The second sealing member 640 may be inserted and seated in the second seating recess 623b formed in the second surface of the camera flange 623.

A first sealing hole 630a for introducing an external sound L1 may be formed in the first sealing member 630, and a second sealing hole 640a through which the external sound L1 introduced through the first sealing hole 630a passes may be formed in the second sealing member 640. For example, the first sealing hole 630a may transfer the external sound L1 introduced through the first opening K1 formed in the camera deco 622 to the second opening K2 formed in the camera flange 623. The external sound L1 transmitted through the second opening K2 may pass through the second sealing hole 640a while being simultaneously transferred to the second sealing hole 640a. The external sound L1 transmitted through the second sealing hole 640a may be transferred to the third opening K3 (e.g., the microphone hole above) formed in the circuit board 650, and the external sound L1 transmitted through the third opening K3 may be transferred to the microphone 661 disposed on the circuit board 650.

For example, the first opening K1 for introducing the external sound L1 may be formed in at least a portion of the camera deco 622, and the second opening K2 facing the first opening K1 may be formed in at least a portion of the camera flange 623. In this case, the first sealing member 630 may be disposed between the camera deco 622 and the first surface of the camera flange 623. A first surface of the first sealing hole 630a formed in the first sealing member 630 may face the first opening K1 of the camera deco 622, and a second surface opposite to the first surface of the first sealing hole 630a may face the second opening K2 of the camera flange 623.

The circuit board 650 may be disposed on the second surface of the camera flange 623. The second sealing member 640 may be disposed between the circuit board 650 and the second surface of the camera flange 623. A first surface of the second sealing member 640 may face the second opening K2 of the camera flange 623, and a second surface opposite to the first surface of the second sealing member 640 may face the third opening K3 of the circuit board 650.

The first opening K1 of the camera deco 622 may face the first surface of the first sealing hole 630a, and the second surface of the first sealing hole 630a may face the second opening K.2 of the camera flange 623. The second opening K2 may face the first surface of the second sealing hole 640a, and the second surface of the second sealing hole 640a may face the third opening K3 of the circuit board 650. The microphone 661 may be disposed in the third opening K3.

In this state, the external sound L1 may be introduced through the first opening K1 of the camera deco 622, and the introduced external sound L1 may sequentially pass through the first sealing hole 630a, the second opening K2, the second sealing hole 640a, and the third opening K3 and may be transferred to the microphone 661 disposed on the circuit board 650. For example, instead of the microphone 661, a speaker may be disposed on the circuit board 650. A structure in which the microphone 661 is disposed on the circuit board 650 is described.

The first sealing hole 630a and the second sealing hole 640a may include a first waterproofing member 631 and a second waterproofing member 641 that block external foreign substances. For example, the first waterproofing member 631 may be disposed in the first sealing hole 630a, and the second waterproofing member 641 may be disposed in the second sealing hole 640a. The first waterproofing member 631 and the second waterproofing member 641 may include a mesh net. The first waterproofing member 631 and the second waterproofing member 641 may include a net other than the mesh net.

As such, as the first sealing member 630 and the second sealing member 640 are configured using the camera flange 623 instead of the interposer 480 between the camera deco 622 and the circuit board 650, the first sealing member 630 and the second sealing member 640 may be disposed on the camera deco 622 which is not influenced by the vibration generated due to introduction of the external sound L1, reducing damage due to vibration and further enhancing the sealing capability.

Further, since the camera deco 622 and the circuit board 650 may be disposed using the camera flange 623 without the interposer 480 in the electronic device 600, it is possible to reduce product assembly processes and the number of components, saving manufacturing costs and further enhancing use of the arrangement space of the product.

An electronic device is provided that includes a housing including a first plate facing a first direction, a second plate facing a second direction that is opposite to the first direction, and a side member surrounding a space between the first plate and the second plate. The electronic device also includes a camera deco disposed on at least one of the first plate and the second plate, a flash disposed proximate to the camera deco, a first circuit board disposed to overlap at least a portion of the flash when viewed in the first direction, and a second circuit board spaced apart from the first circuit board. The electronic device further includes a first sealing member disposed between the second plate and the flash, a second sealing member disposed between the flash and at least one of the first circuit board and the second circuit board, a first component and a second component disposed on at least a portion of the first circuit board or at least a portion of the second circuit board, and an interposer electrically connecting the first circuit board and the second circuit board. A passage for transferring a sound is disposed between a flash hole formed in the second plate and a through hole formed in the flash. The interposer may be disposed between the first circuit board and the second circuit board. An arrangement space for disposing the first component and the second component may be formed between the first circuit board and the second circuit board.

The first sealing member may include a double-sided tape, and the second sealing member may include a waterproofing member.

The first component and the second component may include at least one of a microphone, a speaker, a memory card, a processor, a plurality of sensors, an antenna, a plurality of connectors, an inductor, an active element, a passive element, and a circuit element.

An opening facing the through hole may be formed in at least one of the first circuit board and the second circuit board.

At least one of a microphone and a speaker may be disposed in the opening.

The interposer may be disposed along an edge of the first circuit board and the second circuit board.

A size of the first circuit board may be larger than a size of the second circuit board.

A size of the second circuit board may be larger than a size of the first circuit board.

A size of the first circuit board may be equal to a size of the second circuit board.

A size of the interposer may be smaller than or equal to at least one of a size of the first circuit board or a size of the second circuit board.

An electronic device is provided that includes a housing including a first plate facing a first direction, a second plate facing a second direction that is opposite to the first direction, and a side member surrounding a space between the first plate and the second plate. The electronic device also includes a camera deco disposed on at least one of the first plate and the second plate, a first circuit board disposed to overlap at least a portion of the camera deco when viewed in the first direction, and a second circuit board spaced apart from the first circuit board. The electronic device further includes a sealing member disposed between the camera deco and at least one of the first circuit board and the second circuit board, a first component and a second component disposed on at least a portion of the first circuit board or at least a portion of the second circuit board, and an interposer electrically connecting the first circuit board and the second circuit board. The interposer is disposed between the first circuit board and the second circuit board. An arrangement space for disposing the first component and the second component may be formed between the first circuit board and the second circuit board.

A cover case may be disposed between the camera deco and the sealing member.

The sealing member may further include a waterproofing member.

At least one of the first component, the second component, the interposer, and the sealing member may be at least partially disposed on a first area where the camera deco is disposed and at least partially disposed on a second area where the camera deco is absent.

A first opening may be formed in the camera deco. A second opening facing the first opening may be formed in the cover case. A third opening facing the second opening may be formed in at least one of the first circuit board and the second circuit board.

At least one of a microphone and a speaker may be disposed in the third opening.

An electronic device is provided that includes a housing, a camera deco formed in at least a portion of the housing, and a camera module disposed on the camera deco and including a camera flange. The electronic device also includes a first sealing member disposed between the camera deco and a first surface of the camera flange, a circuit board disposed on a second surface of the camera flange that is opposite to the first surface, a second sealing member disposed between the second surface of the camera flange and the circuit board, and a component disposed on at least a portion of the circuit board.

A first opening may be formed in at least a portion of the camera deco. A second opening, facing the first opening, may be formed in at least a portion of the camera flange. A third opening, facing the second opening, may be formed in at least a portion of the circuit board.

The first sealing member may further include a first waterproofing member. The second sealing member may further include a second waterproofing member.

An electronic device is provided that includes a housing, a first circuit board disposed on at least a portion of the housing and disposed within the housing, a second circuit board spaced apart from the first circuit board, a first component and a second component disposed on at least a portion of the first circuit board or at least a portion of the second circuit board, and an interposer electrically connecting the first circuit board and the second circuit board. The interposer may be disposed between the first circuit board and the second circuit board. An arrangement space for disposing the first component and the second component may be formed between the first circuit board and the second circuit board.

While the disclosure has been shown and described with reference to certain embodiments thereof, it will be understood by those skilled in the art that various changes in form and detail may be made therein without departing from the scope of the disclosure. Therefore, the scope of the disclosure should not be defined as being limited to the embodiments, but should be defined by the appended claims and equivalents thereof.

What is claimed is:

1. An electronic device comprising:
    a housing including a first plate facing a first direction, a second plate facing a second direction that is opposite to the first direction, and a side member surrounding a space between the first plate and the second plate;
    a camera deco disposed on at least one of the first plate and the second plate;
    a flash disposed proximate to the camera deco;
    a first circuit board disposed to overlap at least a portion of the flash when viewed in the first direction;
    a second circuit board spaced apart from the first circuit board;
    a first sealing member disposed between the second plate and the flash;
    a second sealing member disposed between the flash and at least one of the first circuit board and the second circuit board;
    a first component and a second component disposed on at least a portion of the first circuit board or at least a portion of the second circuit board; and
    an interposer electrically connecting the first circuit board and the second circuit board,
    wherein a passage for transferring a sound is disposed between a flash hole formed in the second plate and a through hole formed in the flash, and wherein the interposer is disposed between the first circuit board and the second circuit board and forms an arrangement space for disposing the first component and the second component between the first circuit board and the second circuit board.

2. The electronic device of claim 1, wherein the first sealing member comprises a double-sided tape, and the second sealing member comprises a waterproofing member.

3. The electronic device of claim 1, wherein the first component and the second component comprise at least one of a microphone, a speaker, a memory card, a processor, a plurality of sensors, an antenna, a plurality of connectors, an inductor, an active element, a passive element, and a circuit element.

4. The electronic device of claim 1, wherein an opening facing the through hole is formed in at least one of the first circuit board and the second circuit board.

5. The electronic device of claim 4, wherein at least one of a microphone and a speaker is disposed in the opening.

6. The electronic device of claim 1, wherein the interposer is disposed along an edge of the first circuit board and the second circuit board.

7. The electronic device of claim 1, wherein a size of the first circuit board is larger than a size of the second circuit board.

8. The electronic device of claim 1, wherein a size of the second circuit board is larger than a size of the first circuit board.

9. The electronic device of claim 1, wherein a size of the first circuit board is equal to a size of the second circuit board.

10. The electronic device of claim 1, wherein a size of the interposer is smaller than or equal to at least one of a size of the first circuit board or a size of the second circuit board.

11. An electronic device comprising:
a housing including a first plate facing a first direction, a second plate facing a second direction that is opposite to the first direction, and a side member surrounding a space between the first plate and the second plate;
a camera deco disposed on at least one of the first plate and the second plate;
a first circuit board disposed to overlap at least a portion of the camera deco when viewed in the first direction;
a second circuit board spaced apart from the first circuit board;
a sealing member disposed between the camera deco and at least one of the first circuit board and the second circuit board;
a first component and a second component disposed on at least a portion of the first circuit board or at least a portion of the second circuit board; and
an interposer electrically connecting the first circuit board and the second circuit board,
wherein the interposer is disposed between the first circuit board and the second circuit board and has a closed-loop shape that forms an arrangement space for disposing the first component and the second component between the first circuit board and the second circuit board in the first direction.

12. The electronic device of claim 11, wherein a cover case is disposed between the camera deco and the sealing member.

13. The electronic device of claim 11, wherein the sealing member further comprises a waterproofing member.

14. The electronic device of claim 11, wherein at least one of the first component, the second component, the interposer, and the sealing member is at least partially disposed on a first area where the camera deco is disposed and is at least partially disposed on a second area where the camera deco is absent.

15. The electronic device of claim 12, wherein:
a first opening is formed in the camera deco,
a second opening facing the first opening is formed in the cover case, and
a third opening facing the second opening is formed in at least one of the first circuit board and the second circuit board.

16. The electronic device of claim 15, wherein at least one of a microphone and a speaker is disposed in the third opening.

17. An electronic device comprising:
a housing;
a camera deco formed in at least a portion of the housing;
a camera module disposed on the camera deco and including a camera flange that protrudes from a portion of a periphery of the camera module;
a first sealing member disposed directly between the camera deco and a first surface of the camera flange;
a circuit board disposed on a second surface of the camera flange that is opposite to the first surface;
a second sealing member disposed directly between the second surface of the camera flange and the circuit board; and
a component disposed on at least a portion of the circuit board.

18. The electronic device of claim 17, wherein:
a first opening is formed in at least a portion of the camera deco,
a second opening, facing the first opening, is formed in at least a portion of the camera flange, and
a third opening, facing the second opening, is formed in at least a portion of the circuit board.

19. The electronic device of claim 17, wherein:
the first sealing member further comprises a first waterproofing member, and
the second sealing member further comprises a second waterproofing member.

20. An electronic device comprising:
a housing;
a first circuit board disposed on at least a portion of the housing and disposed within the housing;
a second circuit board spaced apart from the first circuit board;
a first component and a second component disposed on at least a portion of the first circuit board or at least a portion of the second circuit board; and
an interposer electrically connecting the first circuit board and the second circuit board,
wherein the interposer is disposed between the first circuit board and the second circuit board and has a closed-loop shape that forms an arrangement space for disposing the first component and the second component between the first circuit board and the second circuit board in a first direction.

* * * * *